United States Patent
Sato et al.

(10) Patent No.: US 7,600,522 B2
(45) Date of Patent: Oct. 13, 2009

(54) SUBSTRATE TREATMENT METHOD AND SUBSTRATE TREATMENT APPARATUS

(75) Inventors: Masanobu Sato, Kyoto (JP); Sadao Hirae, Kyoto (JP); Shuichi Yasuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 12/397,632

(22) Filed: Mar. 4, 2009

(65) Prior Publication Data

US 2009/0165828 A1 Jul. 2, 2009

Related U.S. Application Data

(62) Division of application No. 10/767,756, filed on Jan. 28, 2004.

(30) Foreign Application Priority Data

May 22, 2003 (JP) ............................ 2003-145267
May 28, 2003 (JP) ............................ 2003-151249

(51) Int. Cl.
  *B08B 3/00* (2006.01)
(52) U.S. Cl. .................. 134/100.1; 134/102.1
(58) Field of Classification Search ........................ None
  See application file for complete search history.

(56) References Cited

U.S. PATENT DOCUMENTS

| 3,296,015 | A | * | 1/1967 | Juvinall et al. | ............... 427/483 |
| 5,918,817 | A | | 7/1999 | Kanno et al. | |
| 5,934,566 | A | | 8/1999 | Kanno et al. | |
| 6,997,405 | B2 | * | 2/2006 | Haruch | ........................ 239/690 |
| 2002/0059947 | A1 | | 5/2002 | Sato et al. | |
| 2003/0141383 | A1 | * | 7/2003 | Hayashi | ....................... 239/406 |
| 2003/0170988 | A1 | | 9/2003 | Izumi et al. | |

FOREIGN PATENT DOCUMENTS

| JP | 56-115538 | 9/1981 |
| JP | 63-54982 | 3/1988 |
| JP | 2-288230 | 11/1990 |
| JP | 3-186369 | 8/1991 |
| JP | 4-21551 | 4/1992 |
| JP | 4-322731 | 11/1992 |
| JP | 8-318181 | 12/1996 |

(Continued)

OTHER PUBLICATIONS

Written Opposition issued Dec. 12, 2006 in connection with the Korean Patent Application No. 10-2004-0011748 (Patent No. 602894).

(Continued)

*Primary Examiner*—Alexander Markoff
*Assistant Examiner*—Nicole Blan
(74) *Attorney, Agent, or Firm*—Ostrolenk Faber LLP

(57) ABSTRACT

A substrate treatment method including the steps of: generating droplets of a treatment liquid by mixing the treatment liquid with a gas; and causing the treatment liquid droplets generated in the liquid droplet generating step to impinge on a surface of a substrate being treated. The treatment liquid droplets have a volume median diameter of 5 μm to 40 μm.

15 Claims, 13 Drawing Sheets

FOREIGN PATENT DOCUMENTS

| | | |
|---|---|---|
| JP | 10-197145 | 7/1998 |
| JP | 2000-254554 | 9/2000 |
| JP | 2001-137747 | 5/2001 |
| JP | 2002-224592 | 8/2002 |
| JP | 2002-270564 | 9/2002 |
| JP | 2003-7663 | 1/2003 |
| JP | 2003-22993 | 1/2003 |
| JP | 2003-022994 | 1/2003 |
| JP | 2003-501257 | 1/2003 |
| JP | 2003-59887 | 2/2003 |
| KR | 1999-013348 | 2/1999 |
| WO | WO 00/76673 | 12/2000 |
| WO | WO 01/49260 | 7/2001 |

OTHER PUBLICATIONS

Office Action issued Jun. 26, 2008 in connection with Japanese Patent Application No. 2003-145267.

Japanese Office Action issued Aug. 21, 2008 in connection with Japanese Application No. 2003-1581248.

Japanese Office Action issued Jan. 22, 2009 in connection with Japanese Application No. 2003-145627.

* cited by examiner

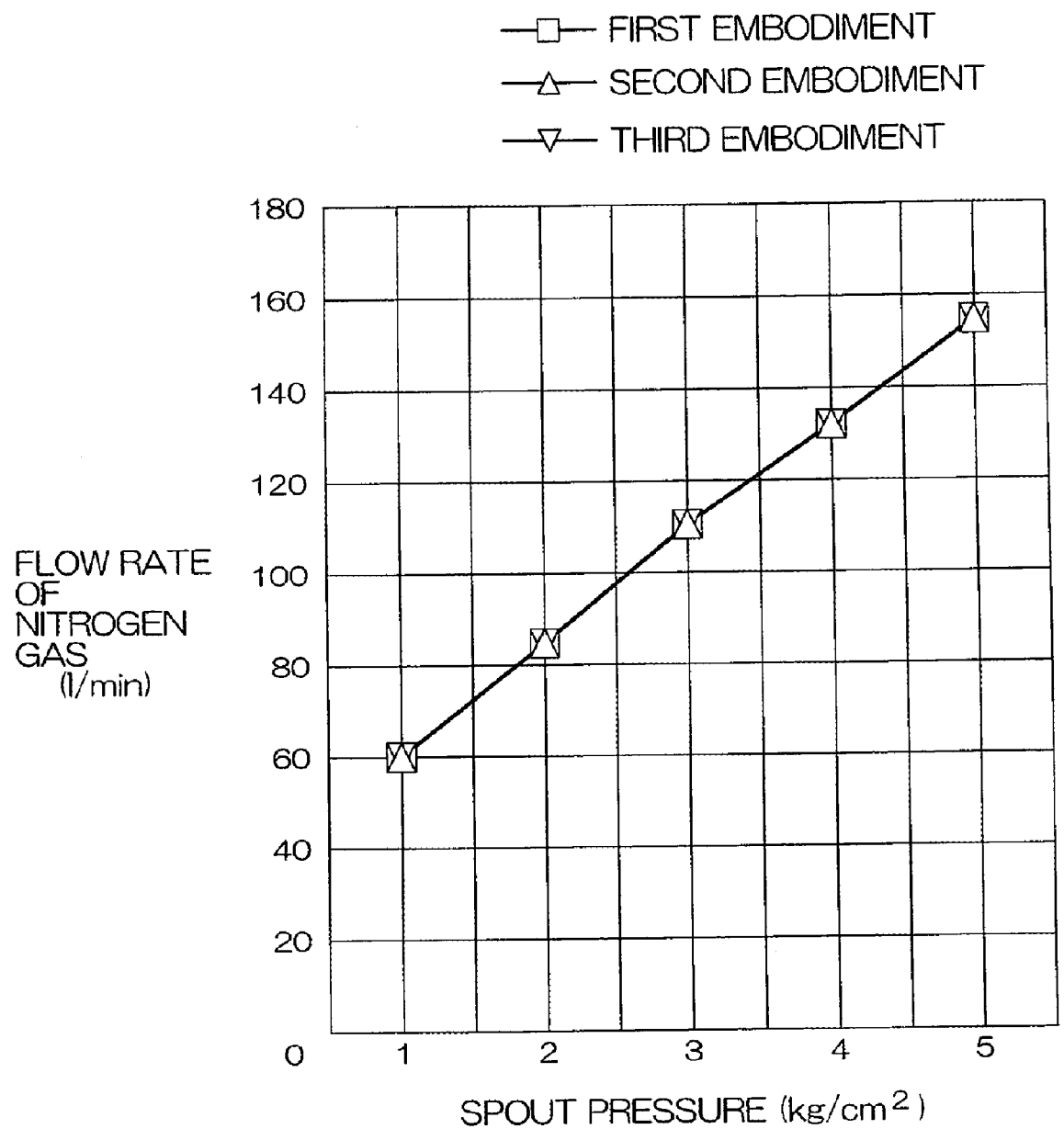

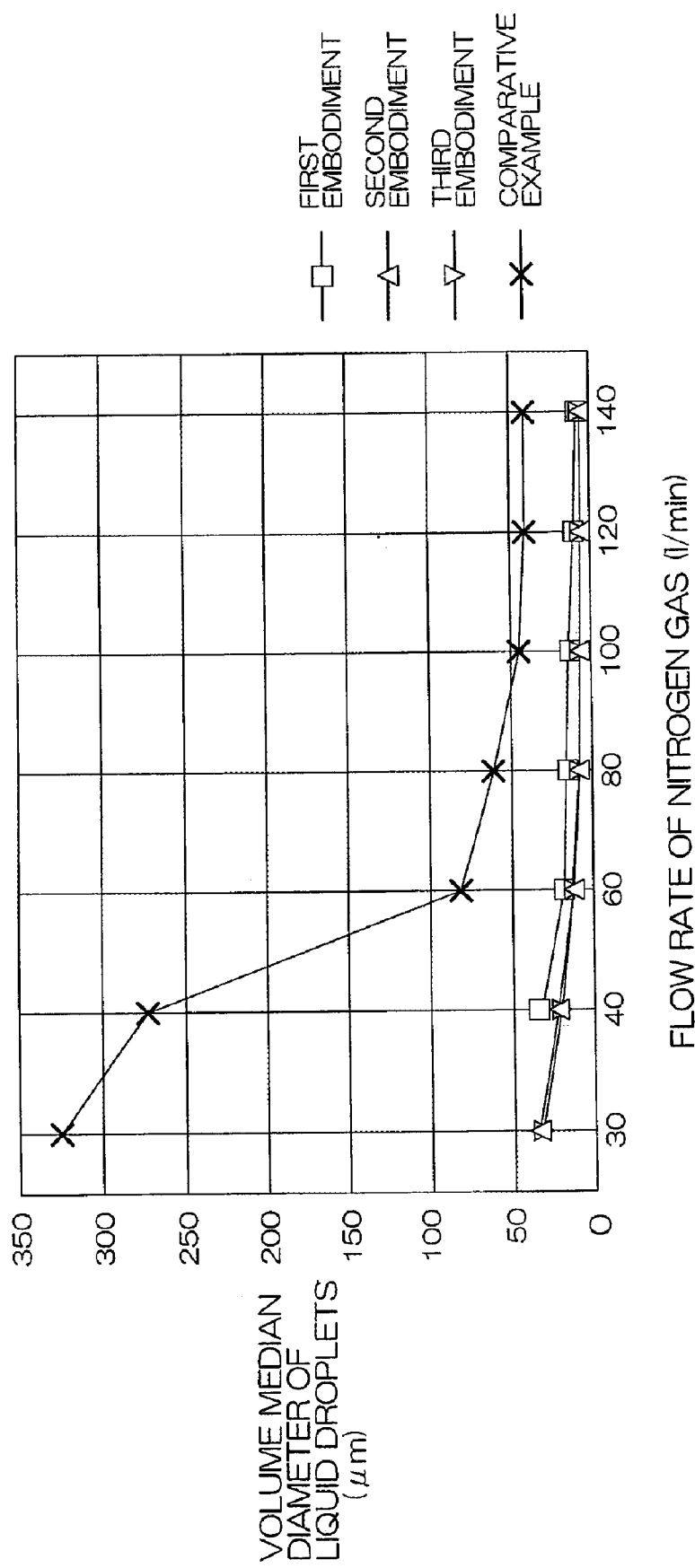

SUBSTRATE TREATMENT METHOD AND SUBSTRATE TREATMENT APPARATUS

CROSS-REFERENCE TO RELATED APPLICATIONS

The present application is a Divisional Application of U.S. Ser. No. 10/767,756 filed Jan. 28, 2004, which application claims the benefit and priority of JP2003-151249 filed May 28, 2003, both incorporated by reference.

BACKGROUND OF THE INVENTION

1. Field of the Invention

The present invention relates to a substrate treatment method and a substrate treatment apparatus for treating a surface of a substrate such as a semiconductor substrate.

2. Description of Related Art

In a semiconductor device production process, particles are liable to adhere on a surface of a semiconductor wafer (hereinafter referred to simply as "wafer"). Therefore, it is necessary to clean the surface of the wafer in a proper step of the production process.

In an exemplary wafer surface cleaning method, droplets of a treatment liquid (cleaning liquid) are generated by mixing the treatment liquid with a gas, and caused to impinge on the wafer surface. This method is implemented by a substrate treatment apparatus which includes a bifluid nozzle adapted to generate and spout the droplets of the treatment liquid by mixing the treatment liquid with the gas. The treatment liquid droplets spouted from the bifluid nozzle are caused to impinge on the wafer, whereby the wafer is cleaned.

FIG. 14 is a schematic sectional view illustrating the construction of the bifluid nozzle provided in the conventional substrate treatment apparatus. The substrate treatment apparatus is disclosed, for example, in Japanese Unexamined Patent Publication No. 2002-270564.

The bifluid nozzle 101 includes an outer cylinder 102 serving as a casing, and an inner cylinder 103 fitted in the outer cylinder 102. The outer cylinder 102 and the inner cylinder 103 each have a generally cylindrical shape, and have a common center axis.

The inside space of the inner cylinder 103 serves as a treatment liquid channel 106, and deionized water (DIW) as the treatment liquid (cleaning liquid) is introduced into the treatment liquid channel 106 from one end of the inner cylinder 103. The treatment liquid channel 106 has an opening provided as a treatment liquid outlet port 107 at the other end of the inner cylinder 103.

In a region of the bifluid nozzle 101 axially opposite from the treatment liquid outlet port 107, the outer diameter of the inner cylinder 103 is substantially equal to the inner diameter of the outer cylinder 102, so that the inner cylinder 103 and the outer cylinder 102 are in intimate contact with each other. In an axially intermediate region of the bifluid nozzle 101 and a region of the bifluid nozzle 101 adjacent to the treatment liquid outlet port 107, the outer diameter of the inner cylinder 103 is smaller than the inner diameter of the outer cylinder 102, so that a generally annular space serving as a gas channel 104 is defined between the inner cylinder 103 and the outer cylinder 102. The gas channel 104 has an annular opening provided as a gas outlet port 108 around the treatment liquid outlet port 107. The treatment liquid outlet port 107 and the gas outlet port 108 are disposed adjacent each other.

A gas inlet pipe 105 is connected to the bifluid nozzle 101, and extends through the outer cylinder 102 with its inside space communicating with the gas channel 104. High-pressure nitrogen gas can be introduced into the gas channel 104 through the gas inlet pipe 105.

When the deionized water and the nitrogen gas are simultaneously introduced into the treatment liquid channel 106 and the gas channel 104, respectively, the deionized water and the nitrogen gas are discharged from the treatment liquid outlet port 107 and the gas outlet port 108, respectively. The deionized water and the nitrogen gas respectively flow through a portion of the treatment liquid channel 106 adjacent to the treatment liquid outlet port 107 and through a portion of the gas channel 104 adjacent to the gas outlet port 108 in parallel relation.

Since the treatment liquid outlet port 107 and the gas outlet port 108 are disposed adjacent each other, the nitrogen gas discharged from the gas outlet port 108 collides (and is mixed) with the deionized water discharged from the treatment liquid outlet port 107, whereby droplets of the deionized water are generated.

When a wafer W is disposed in properly spaced relation with the treatment liquid outlet port 107 and the gas outlet port 108, the deionized water droplets impinge on a surface of the wafer W. At this time, particles adhering on the wafer surface are physically removed by the kinetic energy of the deionized water droplets.

However, the deionized water and the nitrogen gas thus discharged widely diverge outward as departing from the treatment liquid outlet port 107 and the gas outlet port 108. Therefore, the deionized water and the nitrogen gas are not efficiently mixed, making it impossible to efficiently generate deionized water droplets having smaller diameters.

As stated in Japanese Unexamined Patent Publication No. 8-318181 (1996), contaminants on the wafer can advantageously be removed when the liquid droplets have diameters of 1 μm to 100 μm. Where the diameters of the liquid droplets are within this range, the contaminant removal efficiency is virtually constant. However, a minute interconnection pattern formed on the surface of the wafer is liable to be damaged even if liquid droplets having diameters which ensure the advantageous cleaning of the wafer are employed.

The nitrogen gas discharged from the gas outlet port 108 flows ahead while widely diverging outward and, hence, the flow speed of the nitrogen gas steeply decreases as departing from the gas outlet port 108. Accordingly, the speed of the deionized water droplets carried together with the nitrogen gas to the surface of the wafer W steeply decreases. Therefore, the deionized water droplets do not have a sufficiently great kinetic energy when impinging on the wafer W, so that the wafer cleaning efficiency is low.

Further, where the bifluid nozzle 101 provided in the conventional substrate treatment apparatus is employed, the direction of the nitrogen gas discharged from the gas outlet port 108 is unstable. Therefore, the reach range of the deionized water droplets on the wafer W being treated is also unstable, making it impossible to uniformly treat the wafer W.

SUMMARY OF THE INVENTION

It is an object of the present invention to provide a substrate treatment method for cleaning a substrate while suppressing damage to a surface of the substrate.

It is another object of the present invention to provide a substrate treatment apparatus for cleaning a substrate while suppressing damage to a surface of the substrate.

It is further another object of the present invention to provide a substrate treatment apparatus which is capable of generating droplets of a treatment liquid by efficiently mixing the treatment liquid with a gas.

It is still another object of the present invention to provide a substrate treatment apparatus which is capable of efficiently treating a substrate.

According to a first aspect of the present invention, there is provided a substrate treatment method, which comprises; the droplet generating step of generating droplets of a treatment liquid by mixing the treatment liquid with a gas, the treatment liquid droplets having a volume median diameter of 5 μm to 40 μm; and the step of causing the treatment liquid droplets generated in the droplet generating step to impinge on a surface of a substrate being treated.

According to this inventive aspect, the volume median diameter of the treatment liquid droplets is in the range between 5 μm and 40 μm. The term "volume median diameter" herein means a liquid droplet diameter such that the sum of the volumes of liquid droplets having diameters greater (or smaller) than that liquid droplet diameter accounts for 50% of the total volume of all the observed liquid droplets.

If the volume median diameter of the treatment liquid droplets is greater than the aforesaid range, the flow rate of the gas introduced into the bifluid nozzle should be reduced to reduce the kinetic energy of the treatment liquid droplets for suppression of the damage to the substrate by the impingement of the treatment liquid droplets on the substrate. However, this reduces the efficiency of the treatment of the substrate (e.g., the particle removal rate if the treatment of the substrate aims at the removal of particles adhering on the substrate surface).

According to the present invention, on the contrary, the damage to the substrate surface (e.g., damage to an interconnection pattern formed on the substrate surface) can be minimized by controlling the volume median diameter of the treatment liquid droplets within the range between 5 μm and 40 μm without the need for reducing the flow rate of the gas introduced into the bifluid nozzle. Thus, the treatment of the substrate can advantageously be performed.

Examples of the treatment liquid include deionized water and chemical agents such as a mixture of ammonia, hydrogen peroxide, and water.

The volume median diameter of the treatment liquid droplets is preferably 10 μm to 16 μm.

Thus, the damage to the substrate can further be suppressed, and the treatment of the substrate can more advantageously be performed. Where a wafer is cleaned by this substrate treatment method, for example, the number of defects caused by the damage to an interconnection pattern formed on the wafer can be nullified, and particles adhering on the wafer surface can be removed at a removal rate of not smaller than 95%.

The treatment liquid droplets having the aforesaid volume median diameter can be provided by supplying the gas at a flow rate of 58 liters/min to 78 liters/min for collision with the treatment liquid in the liquid droplet generating step. At this time, the treatment liquid may be supplied at a flow rate of about 100 ml/min for collision with the gas.

According to a second aspect of the present invention, there is provided a substrate treatment apparatus, which comprises: a bifluid nozzle having a casing, a liquid outlet port for discharging a treatment liquid, and a gas outlet port for discharging a gas, the bifluid nozzle being adapted to introduce the treatment liquid and the gas into the casing, generate droplets of the treatment liquid by spraying the gas discharged from the gas outlet port over the treatment liquid discharged from the liquid outlet port outside the casing, and spout the droplets on a surface of a substrate; a liquid flow rate adjusting mechanism for adjusting the flow rate of the treatment liquid to be introduced into the bifluid nozzle; a gas flow rate adjusting mechanism for adjusting the flow rate of the gas to be introduced into the bifluid nozzle; and a controller for controlling the liquid flow rate adjusting mechanism and the gas flow rate adjusting mechanism so that the liquid droplets spouted from the bifluid nozzle have a volume median diameter of 5 μm to 40 μm.

The aforesaid substrate treatment method can be implemented by means of the substrate treatment apparatus.

In the case of a bifluid nozzle (of a so-called internal mixing type) adapted to mix the treatment liquid with the gas through collision between the treatment liquid and the gas in a generally closed casing, it is impossible to independently adjust the pressures of the treatment liquid and the gas introduced into the bifluid nozzle under mutual influences.

In the case of the bifluid nozzle of an external mixing type adapted to generate the liquid droplets by spraying the gas over the treatment liquid outside the casing according to the present invention, on the contrary, the pressures of the treatment liquid and the gas introduced into the bifluid nozzle can independently be adjusted. Therefore, where the adjustment of the flow rates of the treatment liquid and the gas introduced into the bifluid nozzle is achieved by adjusting the pressure of the treatment liquid and the pressure of the gas, the flow rate of the treatment liquid and the flow rate of the gas can independently be adjusted.

Further, there is no possibility that the treatment liquid drips on the substrate from the casing after the completion of the treatment of the substrate as in the case where the treatment liquid and the gas are mixed in the casing.

The controller preferably controls the liquid flow rate adjusting mechanism and the gas flow rate adjusting mechanism so as to adjust the volume median diameter of the liquid droplets spouted from the bifluid nozzle at 10 μm to 16 μm.

In this case, the controller may be adapted to control the gas flow rate adjusting mechanism so that the gas is introduced into the bifluid nozzle at a flow rate of 58 liters/min to 78 liters/min. In this case, the controller may be adapted to control the liquid flow rate adjusting mechanism so that the treatment liquid is introduced into the bifluid nozzle at a flow rate of about 100 ml/min.

With this arrangement, the volume median diameter of the treatment liquid droplets generated by the bifluid nozzle can be controlled at 10 μm to 16 μm.

According to a third aspect of the present invention, there is provided a substrate treatment apparatus, which comprises: a substrate holder mechanism for holding a substrate being treated; and a bifluid nozzle comprising a casing having a treatment liquid inlet port for introducing a treatment liquid, a gas inlet port for introducing a gas to be mixed with the treatment liquid introduced from the treatment liquid inlet port, a treatment liquid outlet port for discharging the treatment liquid introduced from the treatment liquid inlet port in a predetermined treatment liquid discharging direction toward a surface of the substrate held by the substrate holder mechanism, and a gas outlet port disposed in the vicinity of the treatment liquid outlet port for discharging the gas introduced from the gas inlet port toward the surface of the substrate held by the substrate holder mechanism, the bifluid nozzle being adapted to generate droplets of the treatment liquid by mixing the treatment liquid discharged from the treatment liquid outlet port with the gas discharged from the gas outlet port in the vicinity of the treatment liquid outlet port outside the casing and spout the treatment liquid droplets on the surface of the substrate held by the substrate holder mechanism, the bifluid nozzle further comprising a spiral gas flow generating section disposed in a gas channel extending from the gas inlet port to the gas outlet port in the casing for generating a spiral gas flow which sheathes the treatment liquid discharged from the treatment liquid outlet port in the treatment liquid discharging direction.

According to this inventive aspect, the gas discharged from the generally annular gas outlet port flows in the form of spiral gas flow. In contrast to a gas flowing straight, the gas flowing in the form of spiral gas does not widely diverge outward. Therefore, the treatment liquid discharged from the treatment liquid outlet port in the predetermined treatment liquid discharging direction is efficiently mixed with the gas discharged in the form of spiral gas flow from the gas outlet port as sheathing the treatment liquid, whereby treatment liquid droplets having smaller diameters are efficiently generated. Hence, there is no possibility that treatment liquid droplets having greater diameters impinge on the substrate held by the substrate holder mechanism to damage the substrate.

The gas discharged from the gas outlet port flows ahead without widely diverging outward and is effectively forced ahead by gas successively discharged from the gas outlet port, so that the gas is not significantly decelerated. Therefore, the treatment liquid droplets carried together with the gas have a greater kinetic energy when impinging on the substrate being treated. Thus, the greater kinetic energy is applied to the surface of the substrate, whereby the substrate surface is efficiently treated (e.g., the particles are efficiently removed).

Further, the bifluid nozzle stabilizes the spouting direction of the treatment liquid droplets, so that the treatment range on the substrate held by the substrate holder mechanism is stabilized. Therefore, the substrate can uniformly be treated by the substrate treatment apparatus.

The treatment liquid may be, for example, a cleaning liquid (e.g., deionized water). In this case, the substrate surface can efficiently be cleaned by the inventive substrate treatment apparatus. The treatment liquid may be an etching liquid. In this case, the substrate surface can efficiently be etched by the inventive substrate treatment apparatus.

The substrate treatment apparatus may further comprise a movement mechanism for shifting the position of the treatment performed by the bifluid nozzle on the substrate held by the substrate holder mechanism.

The bifluid nozzle may have a treatment liquid communication pipe portion which provides a treatment liquid channel extending from the treatment liquid inlet port to the treatment liquid outlet port in the casing, the treatment liquid communication pipe portion limiting at least a portion of the treatment liquid channel adjacent to the treatment liquid outlet port to a linear channel extending in the treatment liquid discharging direction, and a generally annular gas channel defined around the linear channel between the treatment liquid communication pipe portion and an interior surface of the casing.

In this case, the spiral gas flow generating section may comprise a gas flow deflecting member which deflects a gas flow directed toward the gas outlet port along a generating line of the generally annular gas channel into a direction such that the gas flow has a vector component directed circumferentially of the generally annular gas channel.

With this arrangement, the gas flowing along the generating line of the gas channel is deflected into the direction such that the gas flow has the vector component directed circumferentially of the generally annular gas channel by the gas flow deflecting member. Thus, the gas discharged from the gas outlet port is formed into the spiral gas flow in the vicinity of the gas outlet port.

The gas flow deflecting member may be provided integrally with the treatment liquid communication pipe portion as projecting from an outer periphery of the treatment liquid communication pipe portion. In this case, the gas flow deflecting member may be provided, for example, a flange formed with a slit projecting from the outer periphery of the treatment liquid communication pipe portion. The gas passes through the slit, whereby the gas flow is deflected. In this case, the bifluid nozzle incorporating the gas flow deflecting member can be provided simply by inserting a treatment liquid communication pipe having an outward flange in the casing.

The gas flow deflecting member may be adapted to guide the deflected gas flow toward the gas outlet port from at least two circumferentially spaced portions of the generally annular gas channel. By guiding the deflected gas flow toward the gas outlet port from the plurality of portions, the spiral gas flow can be generated as flowing uniformly circumferentially of the gas channel.

The spiral gas flow generating section preferably further comprises a generally annular whirl flow generating portion disposed between the gas flow deflecting member and the gas outlet port in the gas channel in the casing for causing the gas passed through the gas flow deflecting member to flow in the form of whirl flow around the linear channel and guiding the whirl flow to the gas outlet port.

In this case, the gas deflected by the gas flow deflecting member is passed through the whirl flow generating portion, whereby the whirl flow can assuredly be generated around the linear channel through which the treatment liquid flows.

The bifluid nozzle is preferably adapted to generate and spout the treatment liquid droplets so that the flow of the liquid droplets extending from the bifluid nozzle to the surface of the substrate held by the substrate holder mechanism has a contour which has a narrow portion located in the vicinity of the treatment liquid outlet port and a divergent portion diverging from the narrow portion toward the surface of the substrate held by the substrate holder mechanism.

The narrow portion preferably has a shape (a generally cylindrical shape or a generally inverted truncated conical shape) such that the area (diameter) of a cross section (generally round cross section) thereof taken perpendicularly to the treatment liquid discharging direction is generally constant along the treatment liquid discharging direction or decreases toward the substrate held by the substrate holder mechanism. The divergent portion is preferably continuous from an end of the narrow portion on the side of the substrate holder mechanism and has a shape (a generally truncated conical shape) such that the area (diameter) of a cross section (generally round cross section) thereof taken perpendicularly to the treatment liquid discharging direction increases toward the substrate holder mechanism.

In the narrow portion, the treatment liquid discharged from the treatment liquid outlet port and the gas discharged from the gas outlet port are efficiently mixed with each other (collide with each other) within a limited space. Thus, treatment liquid droplets having smaller diameters can assuredly be generated.

The foregoing and other objects, features and effects of the present invention will become more apparent from the following description of the preferred embodiments with reference to the attached drawings.

BRIEF DESCRIPTION OF THE DRAWINGS

FIG. 9 is a diagram illustrating a relationship between a spout pressure and a nitrogen gas flow rate;

FIG. 10 is a diagram illustrating a relationship among the spout pressure, the nitrogen gas flow rate and the volume median diameter of deionized water droplets;

DESCRIPTION OF THE PREFERRED EMBODIMENTS

Figure 1:
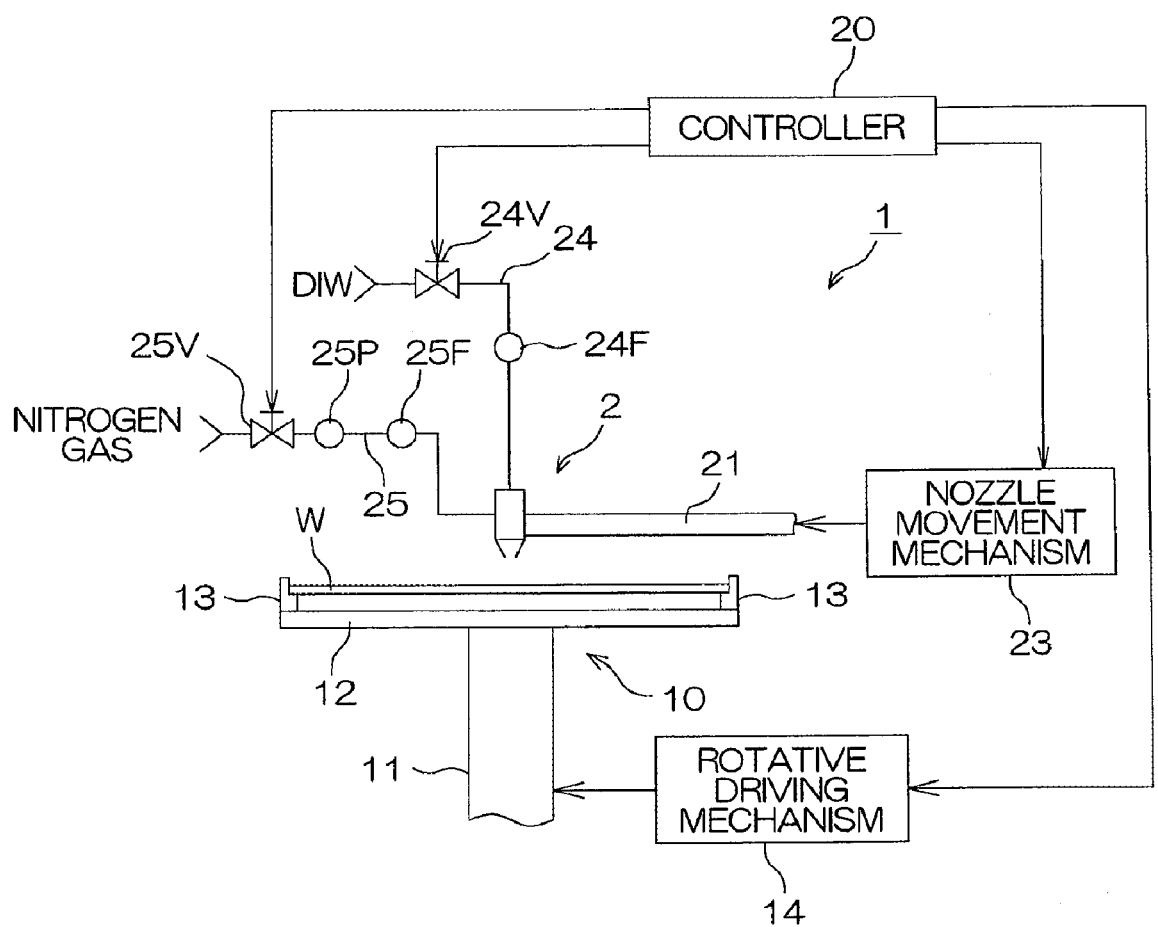
FIG. 1 is a schematic side view illustrating the construction of a substrate treatment apparatus according to a first embodiment of the present invention.

FIG. 1 is a schematic side view illustrating the construction of a substrate treatment apparatus according to a first embodiment of the present invention.

The substrate treatment apparatus 1 is adapted to clean a surface of a semiconductor wafer (hereinafter referred to simply as "wafer") W, and includes a spin chuck 10 which is rotatable while holding the wafer W, and a bifluid nozzle 2 which supplies droplets of deionized water to the wafer W held by the spin chuck 10.

The spin chuck 10 includes a rotation shaft 11 disposed vertically, and a disk-shaped spin base 12 perpendicularly attached to an upper end of the rotation shaft 11. A plurality of chuck pins 13 are provided on a peripheral portion of an upper face of the spin base 12 in circumferentially spaced relation as projecting upright from the spin base 12. The chuck pins 13 are adapted to support a peripheral portion of a lower surface of the wafer W and cooperatively hold the wafer W in abutment against an edge (circumferential surface) of the wafer W. The wafer W is generally horizontally held by the spin chuck 10 with the center thereof aligned with the center axis of the rotation shaft 11.

A rotative driving mechanism 14 is coupled to the rotation shaft 11, and is capable of rotating the rotation shaft 11 about the center axis of the rotation shaft 11. Thus, the wafer W held by the spin chuck 10 can be rotated.

The bifluid nozzle 2 is adapted to be supplied with deionized water (DIW) from a deionized water supply source through a treatment liquid pipe 24. The treatment liquid pipe 24 is provided with a valve 24V for opening and closing the flow path of the deionized water supplied to the bifluid nozzle 2 and adjusting the flow rate of the deionized water. A flow meter 24F is provided downstream of the valve 24V (between the valve 24V and the bifluid nozzle 2) in the treatment liquid pipe 24. The flow meter 24F is capable of measuring the flow rate of the deionized water introduced into the bifluid nozzle 2.

The bifluid nozzle 2 is further adapted to be supplied with high-pressure nitrogen gas from a nitrogen gas supply source through a nitrogen gas pipe 25. The nitrogen gas pipe 25 is provided with a valve 25V for opening and closing the flow path of the nitrogen gas supplied to the bifluid nozzle 2 and adjusting the flow rate of the nitrogen gas. A pressure meter 25P and a flow meter 25F are provided downstream of the valve 25V (between the valve 25V and the bifluid nozzle 2) in the nitrogen gas pipe 25. The pressure meter 25P and the flow meter 25F are respectively capable of measuring the pressure and flow rate of the nitrogen gas introduced into the bifluid nozzle 2.

The bifluid nozzle 2 is coupled to a nozzle movement mechanism 23 via an arm 21. The nozzle movement mechanism 23 is adapted to pivot the arm 21 about a pivot axis extending vertically, whereby the bifluid nozzle 2 connected to the arm 21 can be moved above the wafer W. Thus, the position of the treatment performed by the bifluid nozzle 2 can be shifted along a path extending from the center to the peripheral edge of the wafer W held by the spin chuck 10.

The opening and closing of the valves 24V, 25V and the operations of the rotative driving mechanism 14 and the nozzle movement mechanism 23 can be controlled by a controller 20.

Figure 2:
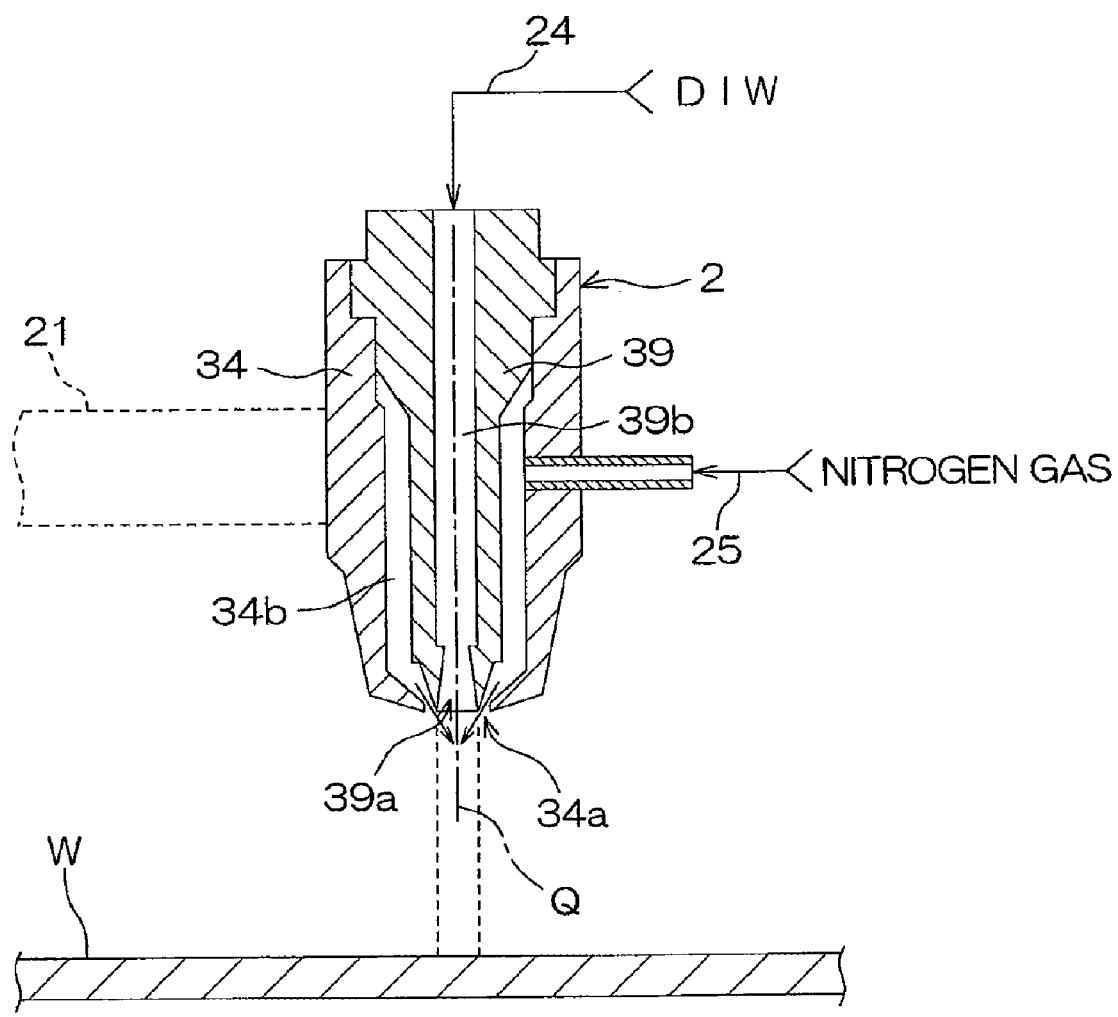
FIG. 2 is a schematic sectional view illustrating the construction of a bifluid nozzle provided in the substrate treatment apparatus shown in FIG. 1.

FIG. 2 is a schematic sectional view illustrating the construction of the bifluid nozzle 2.

The bifluid nozzle 2 is of a so-called external mixing type, which is adapted to collide the gas with the treatment liquid outside a casing thereof (in an open space) to generate droplets of the treatment liquid. The bifluid nozzle 2 includes an inner cylinder 39 and an outer cylinder 34 fitted around the inner cylinder 39 and serving as the casing thereof, and has a generally cylindrical exterior. The inner cylinder 39 and the outer cylinder 34 are coaxially disposed about a common center axis Q. The inside of the inner cylinder 39 serves as a liquid supply hole 39b. A generally annular space serving as a gas supply hole 34b is defined around the center axis Q between the inner cylinder 39 and the outer cylinder 34.

The gas supply hole 34b has an annular opening as a gas outlet port 34a at one end of the bifluid nozzle 2, but has no opening at the other end of the bifluid nozzle 2 with the inner cylinder 39 and the outer cylinder 34 in contact with each other. The gas supply hole 34b has a generally constant diameter in an axially middle region of the bifluid nozzle 2, but has a diameter progressively decreasing toward the one end of the bifluid nozzle 2 in a region of the bifluid nozzle 2 adjacent to the gas outlet port 34a so as to be converged on a point spaced a predetermined distance from the gas outlet port 34a.

The liquid supply hole 39b has an opening as a liquid outlet port 39a in a center portion of the gas outlet port 34a. The bifluid nozzle 2 is mounted in the substrate treatment apparatus 1 with the liquid outlet port 39a and the gas outlet port 34a thereof oriented downward.

The treatment liquid pipe 24 is connected to the end of the bifluid nozzle 2 opposite from the liquid outlet port 39a. The inside space of the treatment liquid pipe 24 communicates with the liquid supply hole 39b so that the deionized water can be introduced into the liquid supply hole 39b. The nitrogen gas pipe 25 is connected to a generally axially middle portion of a peripheral surface of the bifluid nozzle 2. The inside space of the nitrogen gas pipe 25 communicates with the gas supply hole 34b so that the nitrogen gas can be introduced into the gas supply hole 34b.

When the deionized water is supplied into the bifluid nozzle 2 from the treatment liquid pipe 24, the deionized water is discharged from the liquid outlet port 39a. When the nitrogen gas is supplied into the bifluid nozzle 2 from the nitrogen gas pipe 25, the nitrogen gas is discharged from the gas outlet port 34a. The discharged deionized water flows generally straight, while the nitrogen gas discharged annularly flows convergently on the convergent point outside the casing (outside the outer cylinder 34). Therefore, when the deionized water and the nitrogen gas are simultaneously supplied, the nitrogen gas and the deionized water are mixed with each other through collision therebetween at the convergent point, so that the deionized water flows ahead in the form of droplets. That is, a jet flow of the deionized water droplets is generated.

Although the jet flow of the deionized water droplets is illustrated as having a generally constant width in FIG. 2, the jet flow actually flows as diverging from the convergent point toward the wafer W.

Referring to FIG. 1, the cleaning of the surface of the wafer W is achieved by spouting the deionized water droplets toward the upper surface of the wafer W from the bifluid nozzle 2 while rotating the wafer W held on the spin chuck 10 by the rotative driving mechanism 14 and moving the bifluid nozzle 2 above the wafer W by the nozzle movement mechanism 23. The bifluid nozzle 2 is moved between a position opposed to the center of the wafer W and a position opposed to the peripheral edge of the wafer W. Thus, the entire upper surface of the wafer W is uniformly treated.

By introducing the high-pressure nitrogen gas into the bifluid nozzle 2, the deionized water droplets with a greater kinetic energy are caused to impinge on the surface of the wafer W. At this time, particles adhering on the surface of the wafer W are physically removed by the kinetic energy of the deionized water droplets.

Meanwhile, the wafer W may have a minute interconnection pattern formed on the surface thereof. If deionized water droplets having greater diameters impinge on the surface of the wafer W, there is a possibility that the minute interconnection pattern is damaged.

The bifluid nozzle 2 provided in the substrate treatment apparatus 1 is capable of generating deionized water droplets having a volume median diameter of 5 μm to 40 μm. The term "volume median diameter" herein means a liquid droplet diameter such that the sum of the volumes of liquid droplets having diameters greater (or smaller) than that liquid droplet diameter accounts for 50% of the total volume of all the observed liquid droplets. By causing the deionized water droplets having a volume median diameter within the aforesaid range to impinge on the wafer W, the particles adhering on the wafer W can be removed with almost no damage to the minute interconnection pattern formed on the surface of the wafer W.

The volume median diameter of the liquid droplets generated by the bifluid nozzle 2 can be controlled by controlling the flow rate of the nitrogen gas introduced into the bifluid nozzle 2 (valve 25V) and the flow rate of the deionized water introduced into the bifluid nozzle 2 (valve 24V). The controller 20 is capable of controlling the valve 24V and the valve 25V so as to control the volume median diameter of the liquid droplets spouted from the bifluid nozzle 2 at 5 μm to 40 μm.

Further, the controller 20 is capable of controlling the valve 24V so as to introduce the deionized water into the bifluid nozzle 2 at a flow rate of about 100 ml/min, and controlling the valve 25V so as to introduce the nitrogen gas into the bifluid nozzle 2 at a flow rate of 58 liters/min to 78 liters/min. Thus, the volume median diameter of the deionized water droplets spouted from the bifluid nozzle 2 can be controlled at 10 μm to 16 μm.

The bifluid nozzle 2 (of the so-called external mixing type) is adapted to generate the liquid droplets by spraying the gas (nitrogen gas) discharged from the outer cylinder 34 over the liquid (deionized water) discharged from the inner cylinder 39 in the open space. In this case, the pressures of the gas and the liquid introduced into the bifluid nozzle 2 are not mutually influenced. Therefore, the flow rates of the gas and the liquid introduced into the bifluid nozzle 2 can independently be adjusted.

Figure 3:
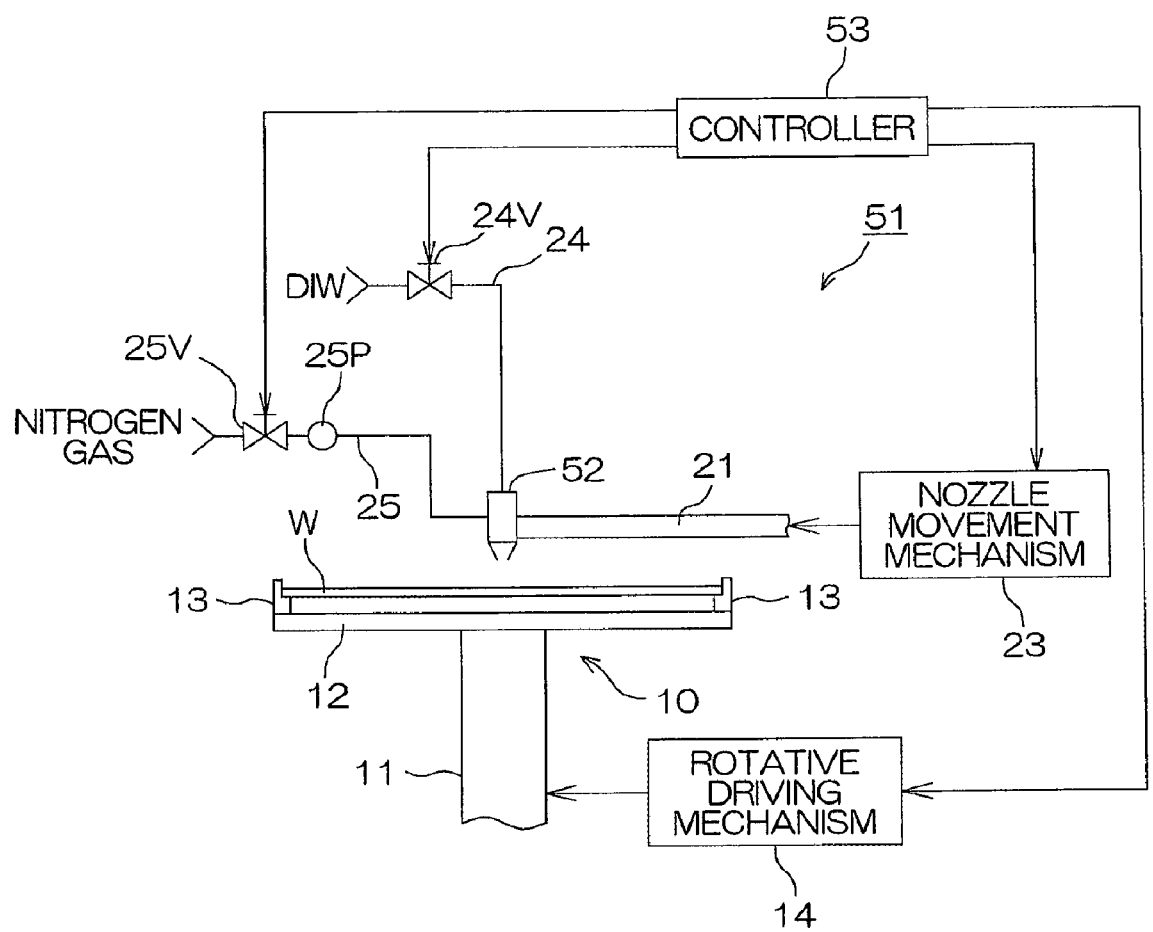
FIG. 3 is a schematic side view illustrating the construction of a substrate treatment apparatus according to a second embodiment of the present invention.

FIG. 3 is a schematic side view illustrating the construction of a substrate treatment apparatus according to a second embodiment of the present invention. In FIG. 3, components corresponding to those shown in FIG. 1 are denoted by the same reference characters as in FIG. 1, and no explanation will be given thereto.

The substrate treatment apparatus 51 includes a spin chuck 10 which is rotatable while generally horizontally holding a wafer W, and a bifluid nozzle 52 which supplies droplets of deionized water as a cleaning liquid to the wafer W held by the spin chuck 10. The bifluid nozzle 52 is adapted to generate the deionized water droplets by a spiral flow of nitrogen gas.

A treatment liquid pipe 24 for supplying the deionized water into the bifluid nozzle 52 from a deionized water supply source is provided with a valve 24V capable of gate control, so that the opening and closing of the flow path of the deionized water supplied into the bifluid nozzle 52 and the flow rate of the deionized water can be controlled.

A nitrogen gas pipe 25 for supplying high-pressure nitrogen gas into the bifluid nozzle 52 from a nitrogen gas supply source is provided with a valve 25V capable of gate control, so that the opening and closing of the flow path of the nitrogen gas supplied into the bifluid nozzle 52 and the flow rate of the nitrogen gas can be controlled.

When the valves 24V, 25V are simultaneously opened to simultaneously introduce the deionized water and the nitrogen gas into the bifluid nozzle 52, the bifluid nozzle 52 generates droplets of the deionized water and spouts the deionized water droplets therefrom. The opening and closing of the valves 24V, 25V and the operations of a rotative driving mechanism 14 and a nozzle movement mechanism 23 are controlled by a controller 53.

Figure 4:
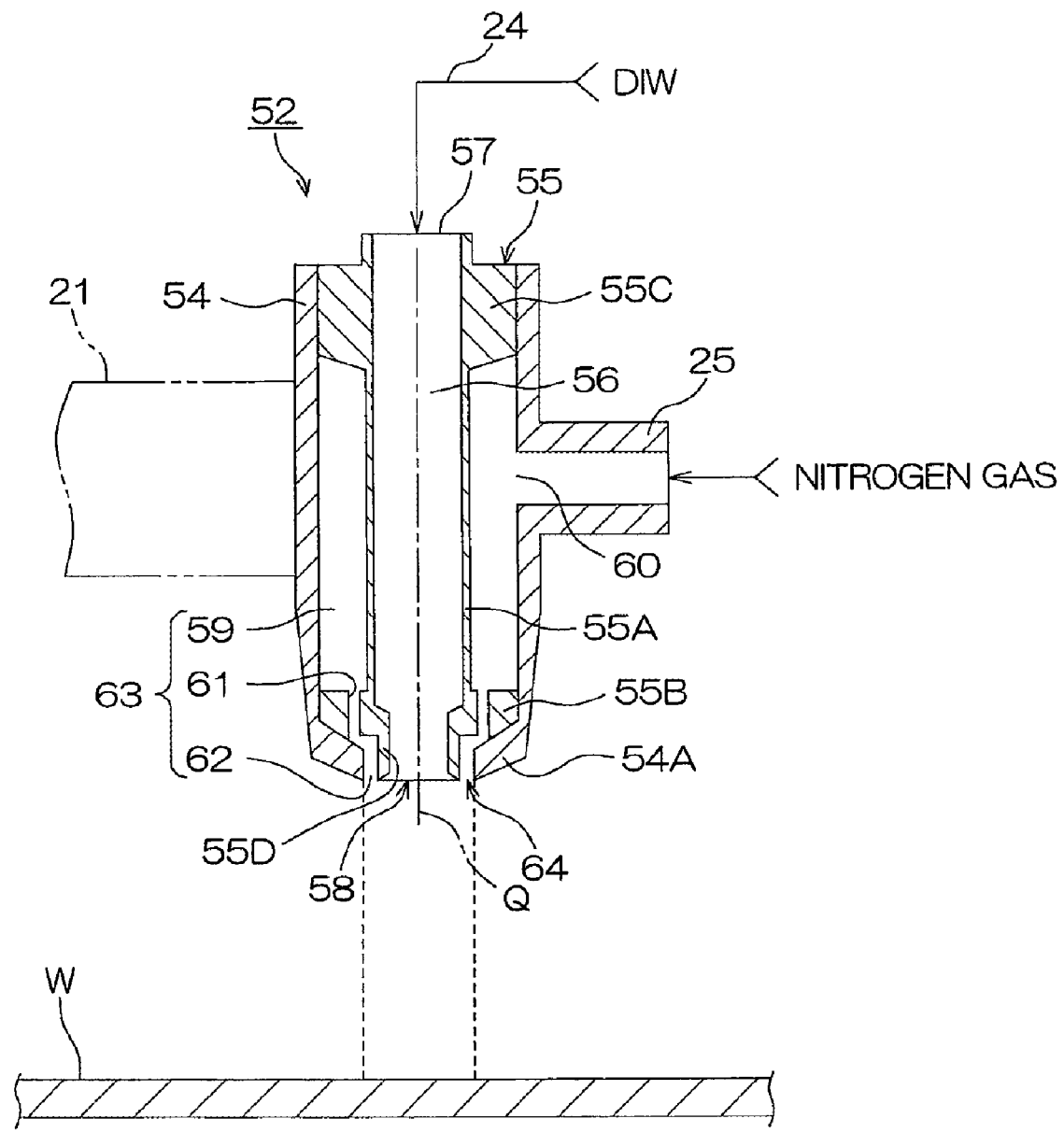
FIG. 4 is a schematic sectional view illustrating the construction of a bifluid nozzle provided in the substrate treatment apparatus shown in FIG. 3.

FIG. 4 is a schematic sectional view illustrating the construction of the bifluid nozzle 52.

The bifluid nozzle 52 is of a so-called external mixing type, which is adapted to collide the nitrogen gas with a treatment liquid (deionized water) outside a casing thereof to generate droplets of the treatment liquid. The bifluid nozzle 52 includes an outer cylinder 54 serving as the casing thereof, and an inner cylinder 55 fitted in the outer cylinder 54, and has a generally cylindrical exterior. The inner cylinder 55 and the outer cylinder 54 are disposed coaxially about a common center axis Q.

The inside space of the inner cylinder 55 serves as a linear treatment liquid channel 56. The treatment liquid channel 56 has an opening as a treatment liquid inlet port 57 at one end of the inner cylinder 55. The treatment liquid pipe 24 is connected to the one end of the inner cylinder 55, so that the deionized water can be introduced into the treatment liquid channel 56 from the treatment liquid pipe 24 through the treatment liquid inlet port 57. The treatment liquid channel 56 further has an opening as a treatment liquid outlet port 58 at the other end of the inner cylinder 55 (opposite from the end thereof connected to the treatment liquid pipe 24).

The flow path of the deionized water is limited linearly along the center axis Q by the inner cylinder 55, so that the deionized water is discharged from the treatment liquid outlet port 58 along the linear axis (center axis Q). In the treatment of the wafer W, the bifluid nozzle 52 is disposed with its center axis Q being perpendicular to the surface of the wafer W.

The outer cylinder 54 has a generally constant inner diameter. On the other hand, the inner cylinder 55 has an outer diameter differing along the center axis Q. An intermediate portion 55A of the inner cylinder 55 has an outer diameter smaller than the inner diameter of the outer cylinder 54.

The inner cylinder 55 has flanges 55B, 55C which are respectively provided integrally therewith in the vicinity of the opposite ends thereof as projecting from the outer circumference thereof. The flanges 55B, 55C each have an outer diameter virtually equal to the inner diameter of the outer cylinder 54. Therefore, the outer circumferences of the flanges 55B, 55C of the inner cylinder 55 intimately contact the interior surface of the outer cylinder 54, and a generally annular space serving as an annular channel 59 is defined around the center axis Q between the intermediate portion 55A of the inner cylinder 55 and the interior surface of the outer cylinder 54.

A gas inlet port 60 is provided in a longitudinally middle portion of the outer cylinder 54 in communication with the annular channel 59. The nitrogen gas pipe 25 is connected to the gas inlet port 60 on the peripheral surface of the outer cylinder 54. The inside space of the nitrogen gas pipe 25 and the annular channel 59 communicate with each other, so that the nitrogen gas can be introduced into the annular channel 59 from the nitrogen gas pipe 25 through the gas inlet port 60.

The flange 55B of the inner cylinder 55 disposed on the side of the treatment liquid outlet port 58 has gas flow deflecting channels 61 extending through the flange 55B along the center axis Q.

An end portion of the outer cylinder 54 adjacent to the treatment liquid outlet port 58 serves as a block portion 54A which has a tapered interior surface having an inner diameter progressively decreasing toward the end. The inner cylinder 55 has a short cylindrical portion 55D projecting from an end of the flange 55B along the center axis Q. The short cylindrical portion 55D is disposed generally centrally of the block portion 54A. The block portion 54A has an inner diameter greater than the outer diameter of the short cylindrical portion 55D. Therefore, a generally annular space serving as a whirl flow generating channel 62 is defined around the center axis Q between the block portion 54A and the short cylindrical portion 55D.

The annular channel 59, the gas flow deflecting channels 61 and the whirl flow generating channel 62 communicate with one another to constitute a gas channel 63. The whirl flow generating channel 62 has an annular opening as a gas outlet port 64 which surrounds the treatment liquid outlet port 58. With this arrangement, the nitrogen gas introduced into the annular channel 59 through the nitrogen gas pipe 25 is discharged from the gas outlet port 64.

The gas flow deflecting channels 61 are disposed in the vicinity of the gas outlet port 64. The treatment liquid outlet port 58 and the gas outlet port 64 are disposed adjacent each other.

In the substrate treatment apparatus 51, the bifluid nozzle 52 is disposed with the treatment liquid outlet port 58 and the gas outlet port 64 being oriented (downward) toward the wafer W held by the spin chuck 10 when the wafer W is cleaned.

Figure 5A:
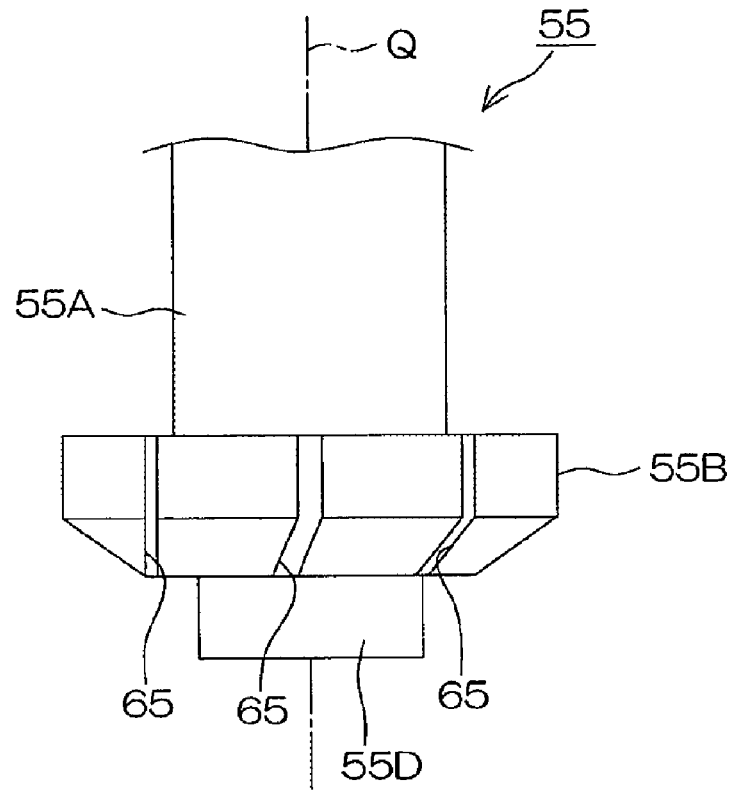
FIGS. 5(a) and 5(b) are a schematic side view and a schematic bottom view, respectively, of an inner cylinder.
Figure 5B:
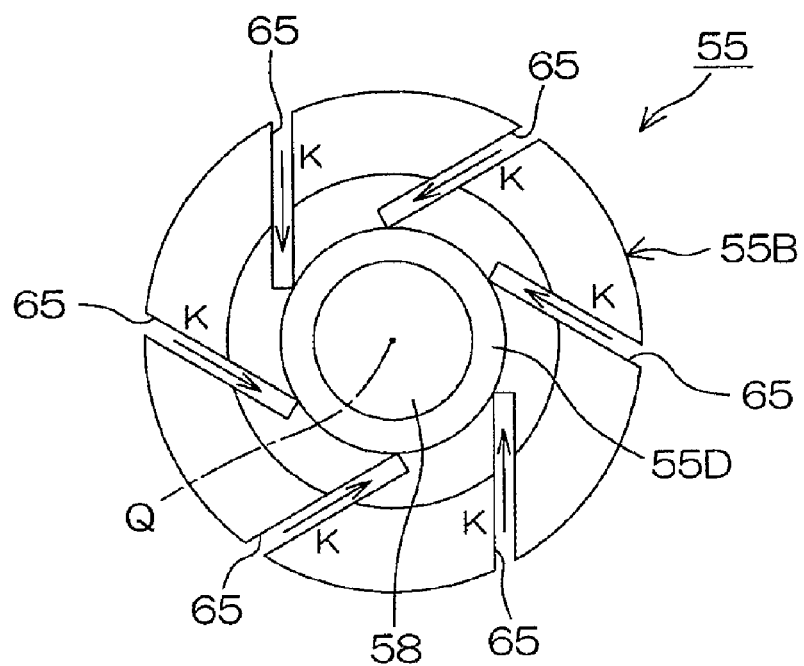

FIGS. 5(a) and 5(b) are a schematic side view and a schematic bottom view, respectively, of the inner cylinder 55. In FIG. 5(a), only the surroundings of the flange 55B are illustrated.

The flange 55B has an umbrella-like shape, and projects radially outward perpendicularly to the center axis Q. The flange 55B is formed with six slits 65. The slits 65 are generally equiangularly arranged as respectively extending inward from the outer circumference of the flange 55B within planes generally parallel to the center axis Q and exclusive of the center axis Q.

The slits 65 respectively obliquely intersect radial lines extending from open ends thereof on the outer circumference of the flange 55B to the center axis Q at substantially the same angle, and extend tangentially of the outer circumference of the short cylindrical portion 55D as seen along the center axis Q (see FIG. 5(b)). Therefore, the slits 65 extend tangentially of the gas outlet port 64 (whirl flow generating channel 62) as seen along the center axis Q in the bifluid nozzle 52.

In the bifluid nozzle 52, the ends of the slits 65 on the outer circumference of the flange 55B are closed by the interior surface of the outer cylinder 54, whereby six gas flow deflecting channels 61 are defined. Open portions of the slits 65 disposed circumferentially of the flange 55B on the side of the short cylindrical portion 55D are covered with the block portion 54A (see FIG. 4). On the other hand, inward portions of the slits 65 are overlapped with the gas outlet port 64 as seen along the center axis Q.

As described above, the bifluid nozzle 52 formed with the gas flow deflecting channels 61 can be provided simply by inserting the inner cylinder 55 having the slits 65 formed in the periphery thereof into the outer cylinder 54.

When the nitrogen gas is introduced into the annular channel 59 from the nitrogen gas pipe 25, the nitrogen gas flows through the annular channel 59 along the generating line of the annular channel 59 toward the gas flow deflecting channels 61, and is guided into the gas flow deflecting channels 61. A part of the nitrogen gas flowing through the gas flow deflecting channels 61 in the vicinity of the outer circumference of the flange 55B flows inwardly of the flange 55B along the interior surface of the block portion 54A (the nitrogen gas flow directions are indicated by arrows K in FIG. 5(b)). At this time, the nitrogen gas flowing along the generating line of the gas channel 63 is deflected into a direction such that the flow of the nitrogen gas has a vector component directed circumferentially of the gas channel 63 (whirl flow generating channel 62).

In the whirl flow generating channel 62, the nitrogen gas can freely flow circumferentially of the whirl flow generating channel 62. Therefore, the nitrogen gas introduced into the whirl flow generating channel 62 from the gas flow deflecting channels 61 flows counterclockwise around the center axis Q (around the treatment liquid channel 56) as seen in FIG. 5(b), and is guided to the gas outlet port 64.

With the provision of the six gas flow deflecting channels 61, the deflected gas flows are guided from six circumferentially spaced portions of the generally annular gas channel 63 into the whirl flow generating channel 62 (toward the gas outlet port 64). Thus, a whirl flow is generated uniformly circumferentially of the whirl flow generating channel 62 (in a whirling direction).

Figure 6:
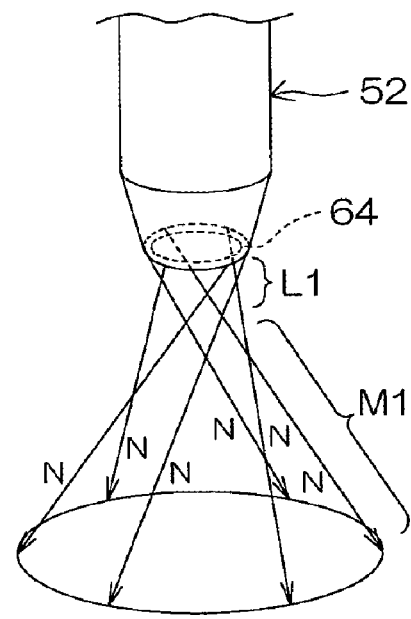
FIG. 6 is a schematic perspective view illustrating the flow directions of nitrogen gas discharged from a gas outlet port of the bifluid nozzle provided in the substrate treatment apparatus shown in FIG. 3.

FIG. 6 is a schematic perspective view illustrating the flow directions of the nitrogen gas discharged from the gas outlet port 64 of the bifluid nozzle 52. In FIG. 6, the flow directions of the nitrogen gas are indicated by arrows N.

The nitrogen gas flows as whirling around the treatment liquid channel 56 in the whirl flow generating channel 62, whereby the nitrogen gas discharged from the gas outlet port 64 flows in the form of spiral flow in the vicinity of the gas outlet port 64. The nitrogen gas is discharged from the gas outlet port 64 after the whirl flow is generated in the whirl flow generating channel 62. Therefore, the spiral flow is circumferentially uniform. The spiral flow of the nitrogen gas sheathes the deionized water discharged from the treatment liquid outlet port 58 along the center axis Q.

Since the slits 65 are provided as extending tangentially of the gas outlet port 64 as seen along the center axis Q, the nitrogen gas discharged from the gas outlet port 64 flows in a direction such that the gas flow has a vector component directing tangentially of the gas outlet port 64. Therefore, the flow of the deionized water droplets carried together with the nitrogen gas from the bifluid nozzle 52 onto the wafer W has a contour which has a narrow portion L1 formed in the vicinity of the treatment liquid outlet port 58 and a divergent portion M1 diverging from the narrow portion L1 toward the surface of the wafer W held by the spin chuck 10.

The narrow portion L1 has a shape (generally inverted truncated conical shape) such that the area (diameter) of a cross section (generally round cross section) thereof taken perpendicularly to the deionized water discharging direction decreases along the deionized water discharging direction toward the wafer W held by the spin chuck 10. The divergent portion M1 is continuous from an end of the narrow portion L1 on the side of the spin chuck 10, and has a shape (generally truncated conical shape) such that the area (diameter) of a cross section (generally round cross section) thereof taken perpendicularly to the deionized water discharging direction increases toward the spin chuck 10. Therefore, the narrow portion L1 and the divergent portion M1 unitarily have a shape like a Japanese hand drum.

The major flow direction of the deionized water droplets spouted from the bifluid nozzle 52 (the center axis of the spiral flow) is perpendicular to the wafer W.

Figure 7:
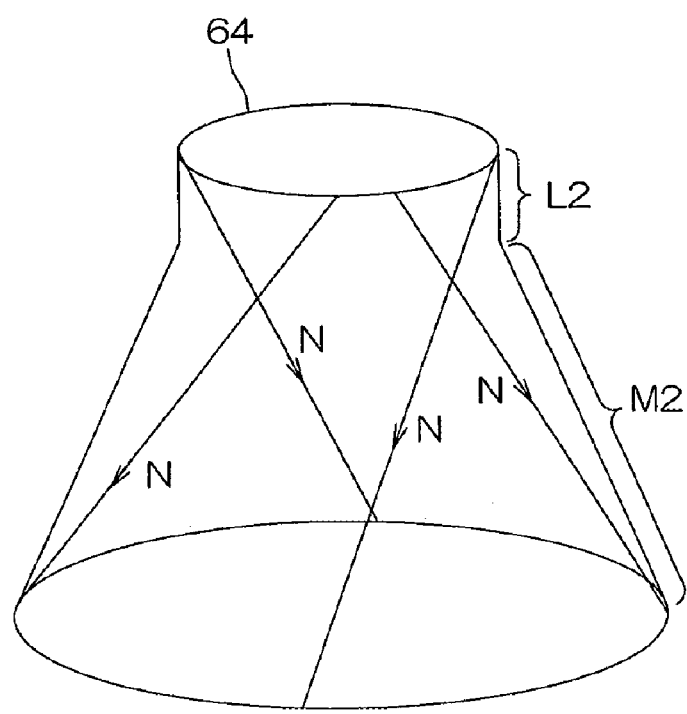
FIG. 7 is a schematic perspective view illustrating the flow directions of nitrogen gas discharged from the gas outlet port of the bifluid nozzle provided in the substrate treatment apparatus shown in FIG. 3 by way of another example.

FIG. 7 is a schematic perspective view illustrating the flow directions of the nitrogen gas discharged from the gas outlet port 64 of the bifluid nozzle 52 by way of another example. In FIG. 7, the flow directions of the nitrogen gas are indicated by arrows N.

The flow of the deionized water droplets carried together with the nitrogen gas from the bifluid nozzle 52 onto the wafer W has a contour which has a narrow portion L2 formed in the vicinity of the treatment liquid outlet port 58 and a divergent portion M2 diverging from the narrow portion L2 toward the surface of the wafer W held by the spin chuck 10.

In this example, the narrow portion L2 has a shape (generally cylindrical shape) such that the area (diameter) of a cross section (generally round cross section) thereof taken perpendicularly to the deionized water discharging direction is generally constant along the deionized water discharging direction. The divergent portion M2 is continuous from an end of the narrow portion L2 on the side of the spin chuck 10 and has a shape (generally truncated conical shape) such that the area (diameter) of a cross section (generally round cross section) thereof taken perpendicularly to the deionized water discharging direction increases toward the spin chuck 10.

As described above, the nitrogen gas flowing from the gas outlet port 64 toward the wafer W is prevented for widely diverging outward in the narrow portion L1, L2. Thus, the deionized water discharged from the treatment liquid outlet port 58 is confined in a limited region, so that the deionized water and the nitrogen gas are efficiently mixed with each other (collide with each other). Therefore, deionized water droplets having smaller diameters are efficiently generated.

The flow of the nitrogen gas thus narrowed in the middle thereof is effectively forced ahead by the nitrogen gas successively discharged from the gas outlet port 64, so that the nitrogen gas can reach the wafer W without significant deceleration. Since the deionized water droplets are carried together with the nitrogen gas discharged from the gas outlet port 64, the deionized water droplets can reach the wafer W without significant deceleration.

That is, the deionized water droplets have a greater kinetic energy when impinging on the wafer W. Thus, the greater kinetic energy is applied to particles adhering on the surface of the wafer W, whereby the particles are removed. Therefore, the surface of the wafer W is efficiently cleaned.

Since the direction of the deionized water droplets spouted from the bifluid nozzle 52 is stabilized, the treatment range on the wafer W held by the spin chuck 10 is stabilized. Therefore, the substrate treatment apparatus 51 can uniformly clean the wafer W.

Figure 8A:
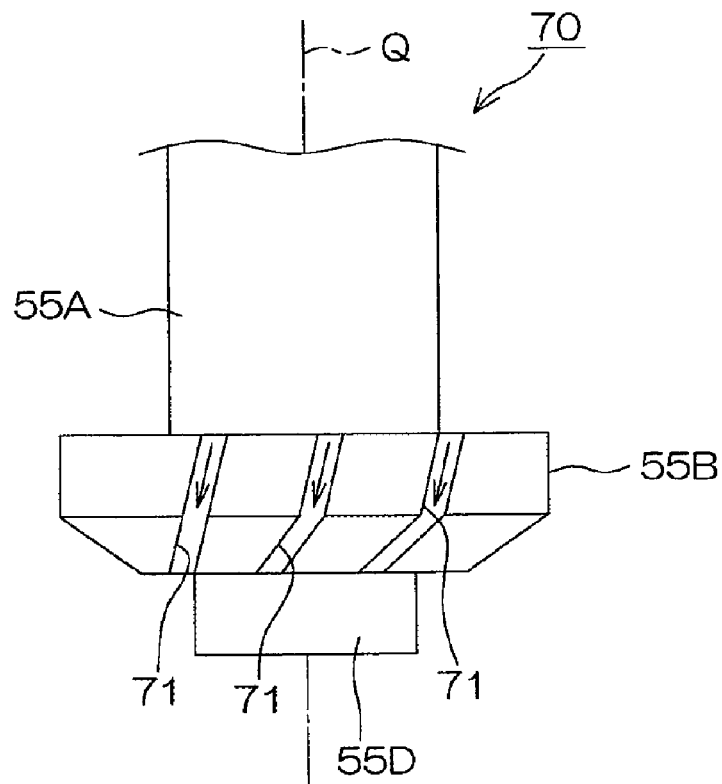
FIGS. 8(a) and 8(b) are a schematic side view and a schematic bottom view, respectively, illustrating the construction of an inner cylinder of a bifluid nozzle provided in a substrate treatment apparatus according to a third embodiment of the present invention.
Figure 8B:
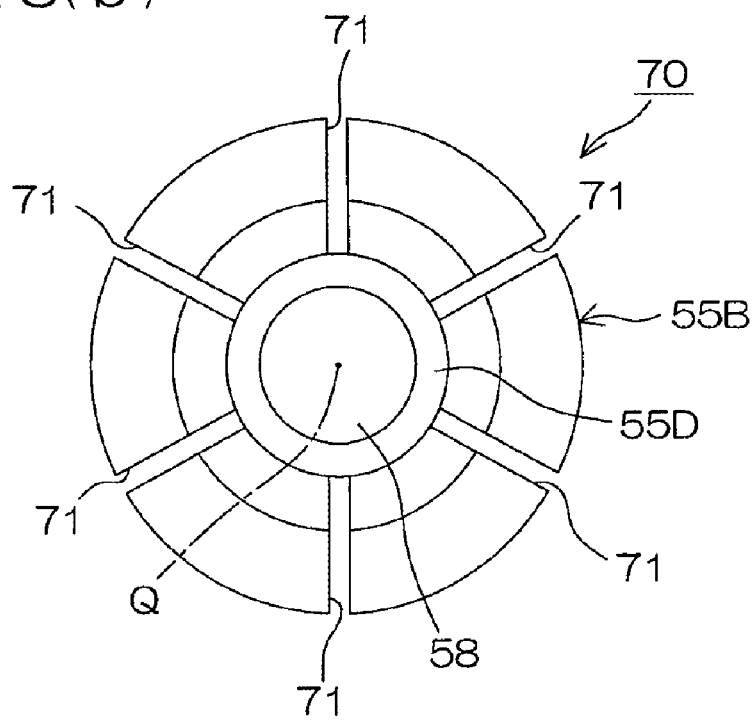

FIGS. 8(*a*) and 8(*b*) are a schematic side view and a schematic bottom view, respectively, illustrating the construction of an inner cylinder of a bifluid nozzle provided in a substrate treatment apparatus according to a third embodiment of the present invention. The inner cylinder 70 is employed instead of the inner cylinder 55 of the bifluid nozzle 52 shown in FIG. 4. In FIGS. 8(*a*) and 8(*b*), components corresponding to those shown in FIGS. 5(*a*) and 5(*b*) are denoted by the same reference characters as in FIGS. 5(*a*) and 5(*b*), and no explanation will be given thereto.

The flange 55B of the inner cylinder 70 is formed with six slits 71. The slits 71 are generally equiangularly arranged as extending inwardly from the outer circumference of the flange 55B. The slits 71 are respectively provided within planes obliquely intersecting the center axis Q, and are open in a surface of the flange 55B on the side of the short cylindrical portion 55D as extending radially of the flange 55B and open in a circumferential surface of the flange 55B as extending obliquely with respect to the center axis Q.

With the inner cylinder 70 fitted in the outer cylinder 54, the open portions of the slits 71 on the outer circumference of the flange 55B are closed by the interior surface of the outer cylinder 54, whereby six gas flow deflecting channels are defined.

In virtually the entire regions of the gas flow deflecting channels, the nitrogen gas introduced into the gas flow deflecting channels (along the generating line of the annular channel 59) is deflected into a direction such that the flow of the nitrogen gas has a vector component directed circumferentially of the gas channel 63. That is, even the flows of the nitrogen gas flowing in regions of the slits 71 away from the block portion 54A each have a vector component directed circumferentially of the gas channel 63.

While the embodiments of the present invention have thus been described, the invention may be embodied in any other ways. For example, pure water such as distilled water prepared by a method other than an ion exchange method may be employed instead of the deionized water, and water containing proper types of impurities in proper amounts may be employed.

The liquid to be introduced into the bifluid nozzle 2, 52 is not limited to the deionized water, and other examples of the liquid include chemical agents such as a mixture of ammonia, hydrogen peroxide, and water. The gas to be introduced into the bifluid nozzle 2 may be an inert gas other than nitrogen gas or compressed air.

In the first embodiment, a bifluid nozzle of an internal mixing type may be employed instead of the bifluid nozzle 2.

In the second and third embodiments, the treatment liquid to be discharged from the bifluid nozzle 52 is not limited to pure water (cleaning liquid), but may be an etching liquid, for example. In this case, the etching liquid and the nitrogen gas are efficiently mixed with each other by the bifluid nozzle 52, whereby droplets of the etching liquid having smaller diameters are generated. Thus, the surface of the wafer W can be etched without any damage to the wafer W.

Since the nitrogen gas discharged from the gas outlet port 64 flows ahead without widely diverging outward, droplets of the etching liquid having a greater kinetic energy impinge on the surface of the wafer W. Therefore, the surface of the wafer W can efficiently be etched.

The bifluid nozzle 52 may be disposed with the center axis Q thereof obliquely intersecting the normal line of the wafer W so that the major flow direction of the deionized water droplets spouted from the bifluid nozzle 52 (the center axis of the spiral flow) is inclined with respect to the wafer W.

EXAMPLE 1

With the use of the substrate treatment apparatus 1 shown in FIG. 1, a test was performed to find out a relationship between the pressure of the nitrogen gas introduced into the bifluid nozzle 2 (hereinafter referred to as "spout pressure") and the flow rate of the nitrogen gas and a relationship between the flow rate of the nitrogen gas and the volume median diameter of the deionized water droplets spouted from the bifluid nozzle 2.

The deionized water was introduced into the bifluid nozzle 2 at three flow rates, i.e., 200 ml/min (first embodiment), 100 ml/min (second embodiment) and 50 ml/min (third embodiment). The spout pressure, the flow rate of the nitrogen gas and the flow rate of the deionized water were respectively measured by the pressure meter 25P, the flow meter 25F and the flow meter 24F.

For comparison, the test was performed in substantially the same manner with the use of the bifluid nozzle (hereinafter referred to as "comparative nozzle") provided in the conventional substrate treatment apparatus. In this case, the deionized water was introduced into the comparative nozzle at a flow rate of 100 ml/ml.

The volume median diameter of the deionized water droplets was measured by means of a particle size distribution measuring apparatus LDSA-1300A of a laser scattering type available from Tohnichi Computer Co., Ltd. The particle size distribution measuring apparatus is adapted to apply a laser beam to the liquid droplets spouted from the bifluid nozzle 2 perpendicularly to the spouting direction, and determine the particle size distribution of the liquid droplets through calculation on the basis of the intensity distribution of light scattered by the liquid droplets on a scatter angle basis. In the measurement, the laser beam was applied to the liquid droplets at a position spaced 30 mm to 50 mm apart from the liquid outlet port 39a of the bifluid nozzle 2.

FIG. 9 is a diagram illustrating the relationship between the spout pressure of the nitrogen gas introduced into the bifluid nozzle 2 and the flow rate of the nitrogen gas.

The flow rate of the nitrogen gas was generally linearly increased, as the spout pressure was increased. Where the nitrogen gas was introduced into the bifluid nozzle 2 at the same pressure, the flow rate of the nitrogen gas was substantially constant irrespective of the flow rate of the deionized water. This indicates that the flow rate of the nitrogen gas can be controlled independently of the flow rate of the deionized water by controlling the spout pressure.

FIG. 10 is a diagram illustrating the relationship between the flow rate of the nitrogen gas and the volume median diameter of the deionized water droplets.

With any of the nitrogen gas flow rates, the volume median diameter of the deionized water droplets generated by the bifluid nozzle 2 was smaller than that of the deionized water droplets generated by the comparative nozzle. Where the bifluid nozzle 2 was employed, the volume median diameter of the deionized water droplets ranged from 5 μm (observed when the flow rate of the deionized water was 50 ml/min and the flow rate of the nitrogen gas was 140 liters/min) to 40 μm (observed when the flow rate of the deionized water was 100 ml/min and the flow rate of the nitrogen gas was 30 liters/min).

Where the comparative nozzle was employed, on the other hand, the volume median diameter of the deionized water droplets ranged from 41.5 μm (observed when the flow rate of the nitrogen gas was 140 liters/min) to 324.2 μm (observed when the flow rate of the nitrogen gas was 30 liters/min). This indicates that the comparative nozzle is not capable of generating deionized water droplets having a volume median diameter of 5 μm to 40 μm under the same conditions as the bifluid nozzle 2.

EXAMPLE 2

A wafer cleaning test was performed with the use of the substrate treatment apparatus 1 shown in FIG. 1.

The flow rate of the deionized water was 100 ml/min. The distance between the bifluid nozzle 2 and the wafer W was 10 mm. The rotation speed of the wafer W rotated by the spin chuck 10 was 500 rpm. The time required for treating the entire surface of the wafer W by moving the bifluid nozzle 2 by the nozzle movement mechanism 23 was 8 seconds.

The wafer W had a 0.25-μm wide interconnection pattern formed on the surface thereof, and carried 10000 silicon (Si) particles having diameters of not smaller than 0.1 μm.

For comparison, the test was performed in the same manner with the use of the comparative nozzle (comparative example).

The particle size distribution and volume median diameter of the deionized water droplets were measured by means of a particle size distribution measuring apparatus LDSA-1300A of a laser scattering type available from Tohnichi Computer Co., Ltd.

Figure 11:
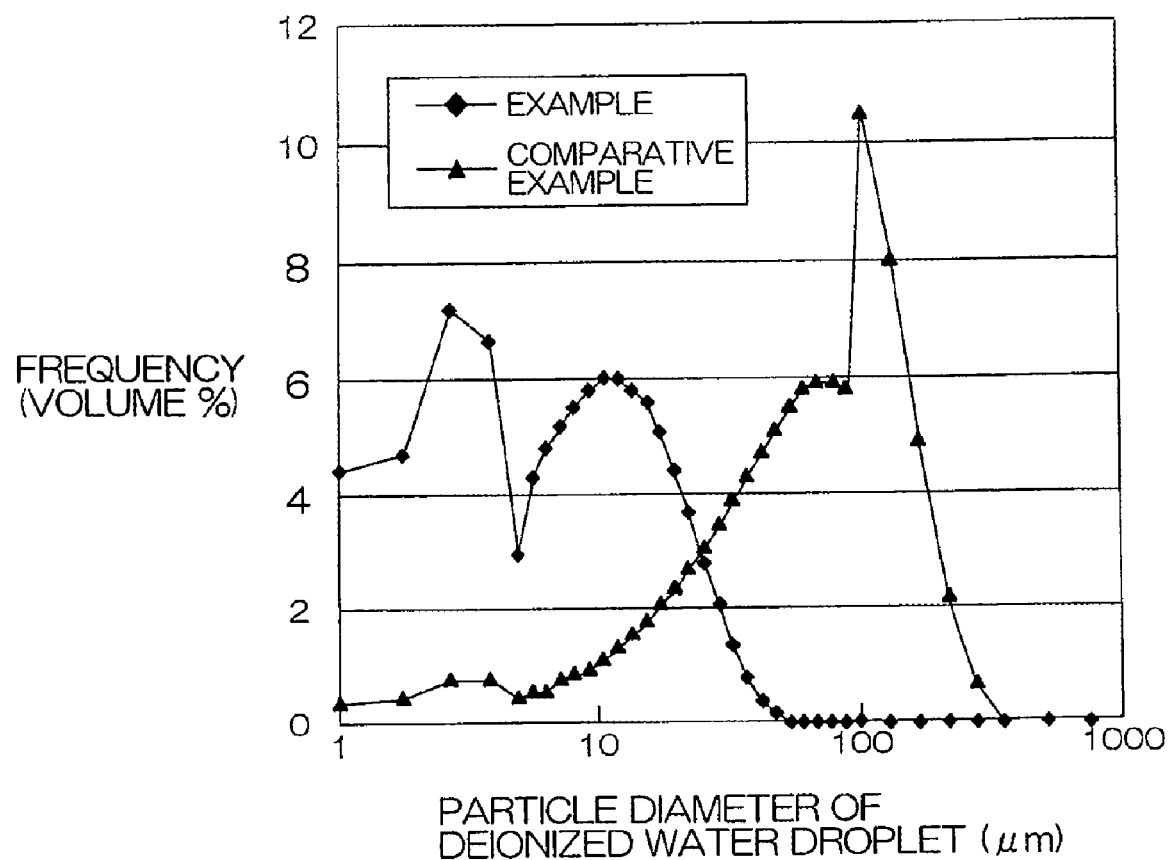
FIG. 11 is a diagram illustrating the particle size distribution of the deionized water droplets by way of an example.

FIG. 11 is a diagram illustrating an example of the particle size distribution of the deionized water droplets.

In the measurement of the particle size distribution of the deionized water droplets, the flow rate of the nitrogen gas was 80 liters/min.

Where the bifluid nozzle 2 was employed, the volume median diameter of the deionized water droplets was about 9.3 μm, and none of the liquid droplets had a diameter greater than 100 μm. Where the comparative nozzle was employed, on the other hand, the volume median diameter of the deionized water droplets was 60.3 μm.

Figure 12:
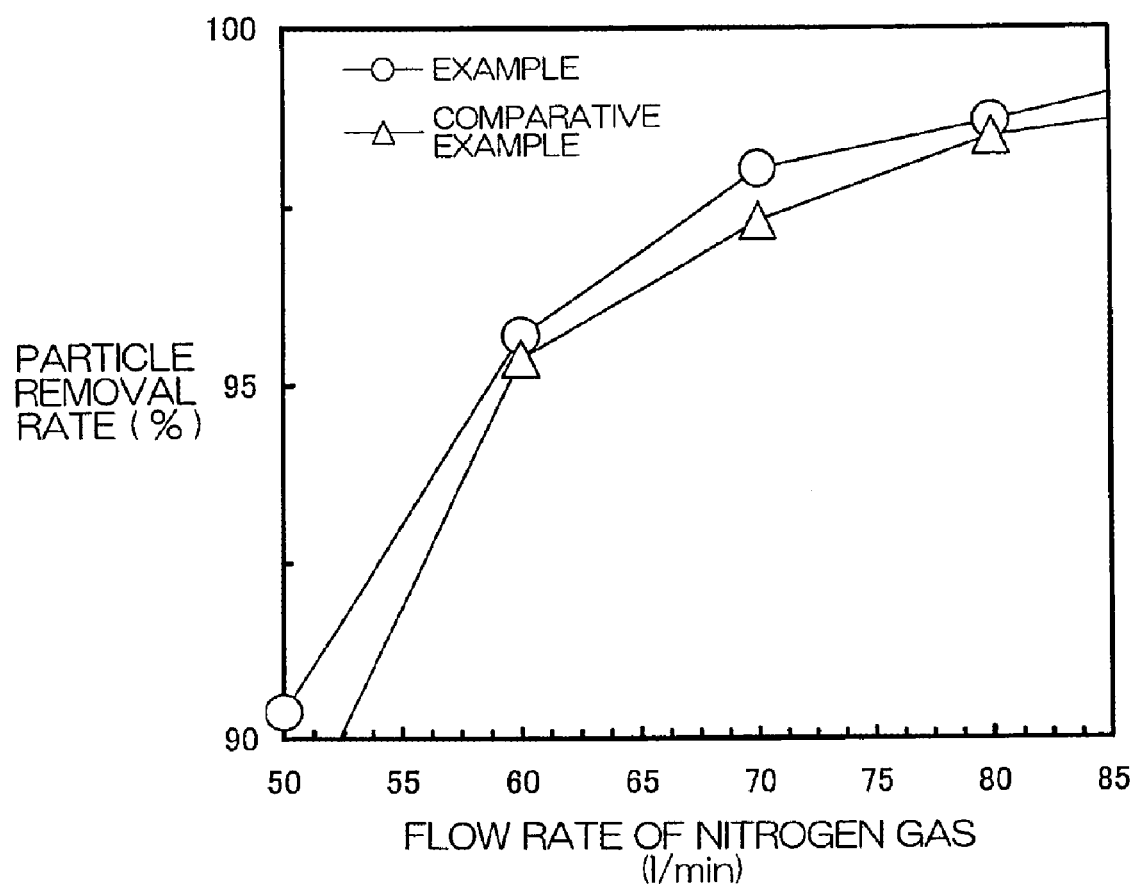
FIG. 12 is a diagram illustrating a relationship between the nitrogen gas flow rate and a particle removal rate.

FIG. 12 is a diagram illustrating a relationship between the flow rate of the nitrogen gas and a particle removal rate. The particle removal rate was determined by measuring the number of silicon particles adhering on the wafer W before and after the cleaning test.

In the case of the bifluid nozzle 2 as well as the comparative nozzle, the particle removal rate was increased, as the flow rate of the nitrogen gas was increased. The flow rate of the nitrogen gas required for ensuring a particle removal rate of not lower than 95% was 58 liters/min or higher in the case of the bifluid nozzle 2, and 59 liters/min or higher in the case of the comparative nozzle.

Figure 13:
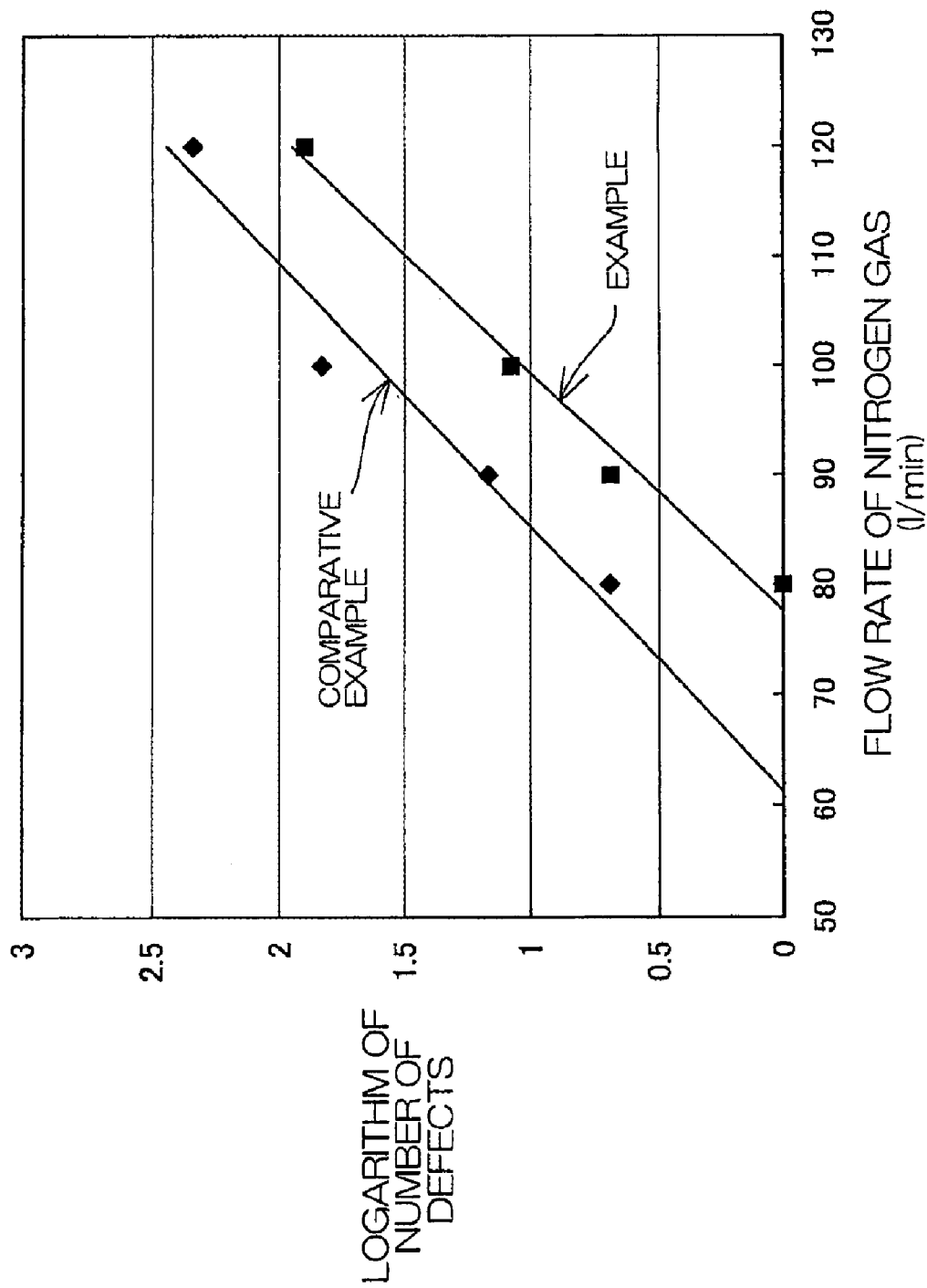
FIG. 13 is a diagram illustrating a relationship between the nitrogen gas flow rate and the number of defects of an interconnection pattern formed on a wafer.
Figure 14:
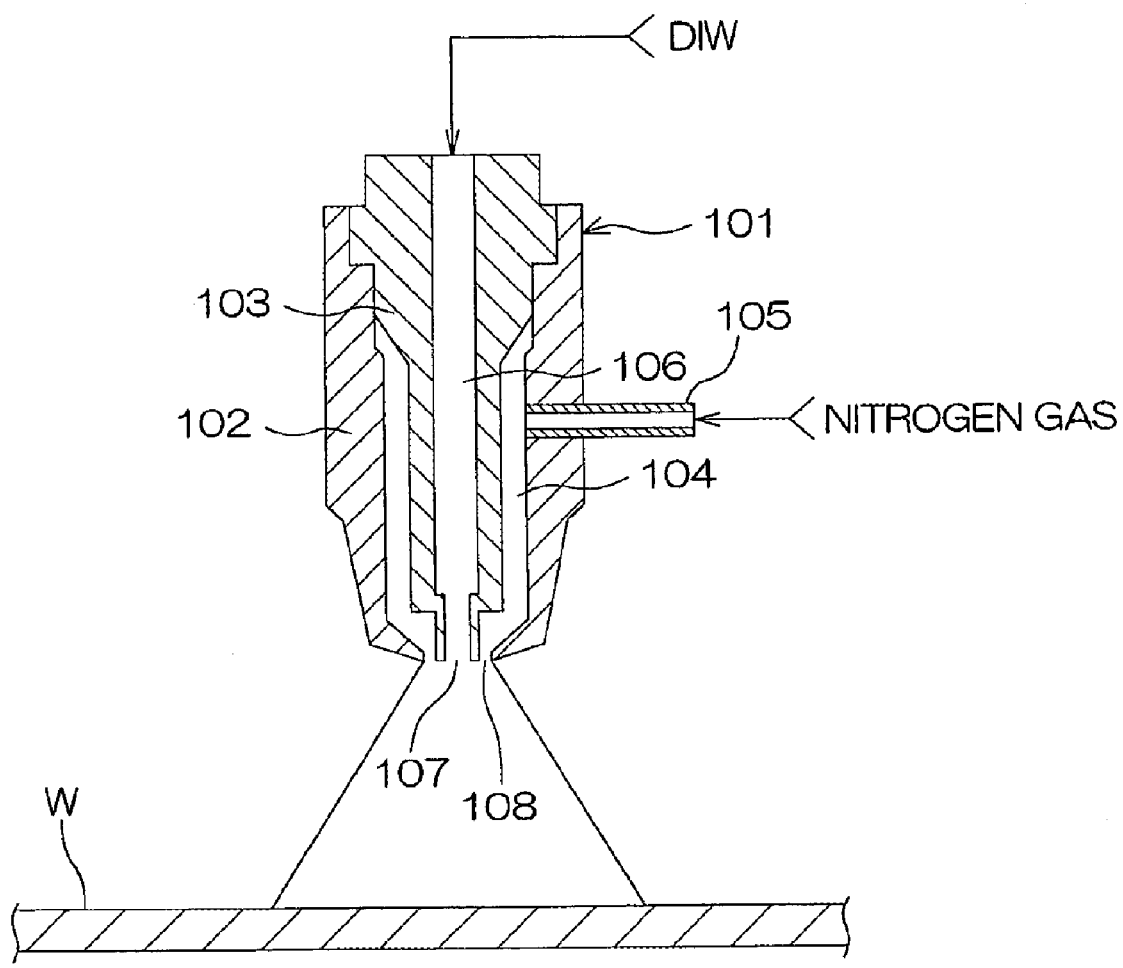
FIG. 14 is a schematic sectional view illustrating the construction of a bifluid nozzle provided in a conventional substrate treatment apparatus.

FIG. 13 is a diagram illustrating a relationship between the flow rate of the nitrogen gas and the number of defects of the interconnection pattern formed on the wafer W. The number of the defects was determined as the number of portions of the interconnection pattern on the surface of the wafer W damaged by the wafer cleaning test.

In the case of the bifluid nozzle 2 as well as the comparative nozzle, the number of the defects was increased, as the flow rate of the nitrogen gas was increased. However, where the comparison was made on the basis of the same nitrogen gas flow rate, the number of the defects was smaller in the case of the bifluid nozzle 2 than in the case of the comparative nozzle.

The nitrogen gas flow rate required for nullifying the number of the defects was 78 liters/min or lower in the case of the bifluid nozzle 2, and 60 liters/min or lower in the case of the comparative nozzle.

As can be seen from FIGS. 12 and 13, the nitrogen gas flow rate required for ensuring a particle removal rate of not lower than 95% and nullifying the number of the defects was 58 liters/min to 78 liters/min in the case of the bifluid nozzle 2. The volume median diameter of the deionized water droplets for this nitrogen gas flow rate was 10 μm to 16 μm as can be understood from the relationship between the nitrogen gas flow rate and the volume median diameter of the deionized water droplets (FIG. 10). That is, it is possible to ensure a particle removal rate of not lower than 95% and nullify the number of the defects by controlling the volume median diameter of the deionized water droplets spouted from the bifluid nozzle 2 at 10 μm to 16 μm.

In the case of the comparative nozzle, on the other hand, the nitrogen gas flow rate required for ensuring a particle removal rate of not lower than 95% while nullifying the number of the defects was 59 liters/min to 60 liters/min. That is, where the comparative nozzle was employed, there was practically no allowable range for the nitrogen gas flow rate. Therefore, it is impossible to ensure a particle removal rate of not lower than 96% while nullifying the number of the defects.

On the other hand, the bifluid nozzle 2 ensured a higher particle removal rate while nullifying the number of the defects over a wider range of the nitrogen gas flow rate. Therefore, it is possible to ensure a particle removal rate of not lower than 96% while nullifying the number of the defects.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-145267 filed with the Japanese Patent Office on May 22, 2003 and Japanese Patent Application No. 2003-151249 filed with the Japanese Patent Office on May 28, 2003, the disclosure thereof being incorporated herein by reference.

What is claimed is:

1. A substrate treatment apparatus comprising:
a substrate holder mechanism for holding a substrate being treated; and
a bifluid nozzle comprising a casing having a center axis, a treatment liquid inlet port for introducing a treatment liquid, a gas inlet port for introducing a gas to be mixed with the treatment liquid introduced from the treatment liquid inlet port, a treatment liquid outlet port for discharging the treatment liquid introduced from the treatment liquid inlet port in a predetermined treatment liquid discharging direction toward a surface of the substrate held by the substrate holder mechanism, and a gas outlet port disposed in the vicinity of the treatment liquid outlet port for discharging the gas introduced from the gas inlet port toward the surface of the substrate held by the substrate holder mechanism, the bifluid nozzle being adapted to generate droplets of the treatment liquid by mixing the treatment liquid discharged from the treatment liquid outlet port with the gas discharged from the gas outlet port in the vicinity of the treatment liquid outlet port outside the casing and spout the treatment liquid droplets on the surface of the substrate held by the substrate holder mechanism, the bifluid nozzle further comprising a spiral gas flow generating section disposed in a gas channel extending from the gas inlet port to the gas outlet port in the casing for generating a spiral gas flow which sheathes the treatment liquid discharged from the treatment liquid outlet port in the treatment liquid discharging direction,
wherein the bifluid nozzle has a treatment liquid channel extending from the treatment liquid inlet port to the treatment liquid outlet port in the casing, a treatment liquid communication pipe portion which limits at least a portion of the treatment liquid channel adjacent to the treatment liquid outlet port to a linear channel extending in the treatment liquid discharging direction, and a generally annular gas channel defined around the linear channel between the treatment liquid communication pipe portion and an interior surface of the casing,
wherein the spiral gas flow generating section comprises a gas flow deflecting member which deflects a gas flow directed toward the gas outlet port along a generating line of the generally annular gas channel into a direction such that the gas flow has a vector component directed circumferentially of the generally annular gas channel, the gas flow deflecting member being formed with a plurality of slits which respectively obliquely intersect radial directions with respect to the center axis at the same angle along the center axis,
wherein the spiral gas flow generating section further comprises a generally annular whirl flow generating portion disposed between the gas flow deflecting member and the gas outlet port in the gas channel in the casing for causing the gas passed through the gas flow deflecting member to flow in the form of whirl flow around the linear channel and guiding the whirl flow to the gas outlet port,
wherein inward portions of cross-sections of the plurality of slits are overlapped with a cross-section of the gas outlet port.

2. A substrate treatment apparatus as set forth in claim 1, further comprising a movement mechanism for shifting a position of a treatment performed by the bifluid nozzle on the substrate held by the substrate holder mechanism.

3. A substrate treatment apparatus as set forth in claim 1, wherein the gas flow deflecting member is provided integrally with the treatment liquid communication pipe portion as projecting from an outer periphery of the treatment liquid communication pipe portion.

4. A substrate treatment apparatus as set forth in claim 1, wherein the gas flow deflecting member is adapted to guide the deflected gas flow toward the gas outlet port from at least two circumferentially spaced portions of the generally annular gas channel.

5. A substrate treatment apparatus as set forth in claim 1, wherein the bifluid nozzle is adapted to generate and spout the treatment liquid droplets so that a flow of the liquid droplets extending from the bifluid nozzle to the surface of the substrate held by the substrate holder mechanism has a contour which has a narrow portion located in the vicinity of the treatment liquid outlet port and a divergent portion diverging from the narrow portion toward the surface of the substrate held by the substrate holder mechanism, wherein the narrow portion has a shape such that a cross section thereof taken perpendicularly to the treatment liquid discharging direction has an area generally constant along the treatment liquid discharging direction or an area decreasing toward the substrate held by the substrate holder mechanism.

6. A substrate treatment apparatus comprising:

a substrate holder mechanism for holding a substrate being treated; and a bifluid nozzle comprising a casing having a center axis, a treatment liquid inlet port for introducing a treatment liquid, a gas inlet port for introducing a gas to be mixed with the treatment liquid introduced from the treatment liquid inlet port, a treatment liquid outlet port for discharging the treatment liquid introduced from the treatment liquid inlet port in a predetermined treatment liquid discharging direction toward a surface of the substrate held by the substrate holder mechanism, and a gas outlet port disposed in the vicinity of the treatment liquid outlet port for discharging the gas introduced from the gas inlet port toward the surface of the substrate held by the substrate holder mechanism, the bifluid nozzle being adapted to generate droplets of the treatment liquid by mixing the treatment liquid discharged from the treatment liquid outlet port with the gas discharged from the gas outlet port in the vicinity of the treatment liquid outlet port outside the casing and spout the treatment liquid droplets on the surface of the substrate held by the substrate holder mechanism, the bifluid nozzle further comprising a spiral gas flow generating section disposed in a gas channel extending from the gas inlet port to the gas outlet port in the casing for generating a spiral gas flow which sheathes the treatment liquid discharged from the treatment liquid outlet port in the treatment liquid discharging direction, wherein the bifluid nozzle has a treatment liquid channel extending from the treatment liquid inlet port to the treatment liquid outlet port in the casing, a treatment liquid communication pipe portion which limits at least a portion of the treatment liquid channel adjacent to the treatment liquid outlet port to a linear channel extending in the treatment liquid discharging direction, and a generally annular gas channel defined around the linear channel between the treatment liquid communication pipe portion and an interior surface of the casing, wherein the spiral gas flow generating section comprises a gas flow deflecting member which deflects a gas flow directed toward the gas outlet port along a generating line of the generally annular gas channel into a direction such that the gas flow has a vector component directed circumferentially of the generally annular gas channel, the gas flow deflecting member being formed with a plurality of slits, wherein the gas flow deflecting member comprises a flange projecting from an outer circumference of the treatment liquid communication pipe portion, the plurality of slits being formed as respectively extending inward from an outer circumference of the flange, wherein the spiral gas flow generating section further comprises a generally annular whirl flow generating portion disposed between the gas flow deflecting member and the gas outlet port in the gas channel in the casing for causing the gas passed through the gas flow deflecting member to flow in the form of whirl flow around the linear channel and guiding the whirl flow to the gas outlet port wherein inward portions of cross-sections of the plurality of slits are overlapped with a cross-section of the gas outlet port.

7. A substrate treatment apparatus as set forth in claim 6, further comprising a movement mechanism for shifting a position of a treatment performed by the bifluid nozzle on the substrate held by the substrate holder mechanism.

8. A substrate treatment apparatus as set forth in claim 6, wherein the gas flow deflecting member is provided integrally with the treatment liquid communication pipe portion as projecting from an outer periphery of the treatment liquid communication pipe portion.

9. A substrate treatment apparatus as set forth in claim 6, wherein the gas flow deflecting member is adapted to guide the deflected gas flow toward the gas outlet port from at least two circumferentially spaced portions of the generally annular gas channel.

10. A substrate treatment apparatus as set forth in claim 6, wherein the bifluid nozzle is adapted to generate and spout the treatment liquid droplets so that a flow of the liquid droplets extending from the bifluid nozzle to the surface of the substrate held by the substrate holder mechanism has a contour which has a narrow portion located in the vicinity of the treatment liquid outlet port and a divergent portion diverging from the narrow portion toward the surface of the substrate held by the substrate holder mechanism, wherein the narrow portion has a shape such that a cross section thereof taken perpendicularly to the treatment liquid discharging direction has an area generally constant along the treatment liquid discharging direction or an area decreasing toward the substrate held by the substrate holder mechanism.

11. A substrate treatment apparatus comprising:

a substrate holder mechanism for holding a substrate being treated; and a bifluid nozzle comprising a casing having a treatment liquid inlet port for introducing a treatment liquid, a gas inlet port for introducing a gas to be mixed with the treatment liquid introduced from the treatment liquid inlet port, a treatment liquid outlet port for discharging the treatment liquid introduced from the treatment liquid inlet port in a predetermined treatment liquid discharging direction toward a surface of the substrate held by the substrate holder mechanism, and a gas outlet port disposed in the vicinity of the treatment liquid outlet port for discharging the gas introduced from the gas inlet port toward the surface of the substrate held by the substrate holder mechanism, the bifluid nozzle being adapted to generate droplets of the treatment liquid by mixing the treatment liquid discharged from the treatment liquid outlet port with the gas discharged from the gas outlet port in the vicinity of the treatment liquid outlet port outside the casing and spout the treatment liquid droplets on the surface of the substrate held by the substrate holder mechanism, the bifluid nozzle further comprising a spiral gas flow generating section disposed in a gas channel extending from the gas inlet port to the gas outlet port in the casing for generating a spiral gas flow which sheathes the treatment liquid discharged from the treatment liquid outlet port in the treatment liquid discharging direction, wherein the bifluid nozzle has a treatment liquid channel extending from the treatment liquid inlet port to the treatment liquid outlet port in the casing, a treatment liquid communication pipe portion which limits at least a portion of the treatment liquid channel adjacent to the treatment liquid outlet port to a linear channel extending in the treatment liquid discharging direction, and a generally annular gas channel defined around the linear channel between the treatment liquid communication pipe portion and an interior surface of the casing, wherein the spiral gas flow generating section comprises a gas flow deflecting member which deflects a gas flow directed toward the gas outlet port along a generating line of the generally annular gas channel into a direction such that the gas flow has a vector component directed circumferentially of the generally annular gas channel, wherein the spiral gas flow generating section further comprises a generally annular whirl flow generating portion disposed between the gas flow deflecting member and the gas outlet port in the gas channel in the casing for causing the gas passed through the gas flow deflecting member to flow in the form of whirl flow around the linear channel and guiding the whirl flow to the gas outlet port, wherein in the gas flow deflecting member, an inward portion of a region in which the gas flow is deflected is overlapped with the gas outlet port along a generating line of the generally annular gas channel, the inward portion of the region being located at a side of the linear channel for the treatment liquid in the gas flow deflecting member.

12. A substrate treatment apparatus as set forth in claim 11, further comprising a movement mechanism for shifting a position of a treatment performed by the bifluid nozzle on the substrate held by the substrate holder mechanism.

13. A substrate treatment apparatus as set forth in claim 11, wherein the gas flow deflecting member is provided integrally with the treatment liquid communication pipe portion as projecting from an outer periphery of the treatment liquid communication pipe portion.

14. A substrate treatment apparatus as set forth in claim 11, wherein the gas flow deflecting member is adapted to guide the deflected gas flow toward the gas outlet port from at least two circumferentially spaced portions of the generally annular gas channel.

15. A substrate treatment apparatus as set forth in claim 11, wherein the bifluid nozzle is adapted to generate and spout the treatment liquid droplets so that a flow of the liquid droplets extending from the bifluid nozzle to the surface of the substrate held by the substrate holder mechanism has a contour which has a narrow portion located in the vicinity of the treatment liquid outlet port and a divergent portion diverging from the narrow portion toward the surface of the substrate held by the substrate holder mechanism, wherein the narrow portion has a shape such that a cross section thereof taken perpendicularly to the treatment liquid discharging direction has an area generally constant along the treatment liquid discharging direction or an area decreasing toward the substrate held by the substrate holder mechanism.

\* \* \* \* \*